(12) United States Patent
Wei et al.

(10) Patent No.: US 9,082,479 B2
(45) Date of Patent: Jul. 14, 2015

(54) NONVOLATILE MEMORY ELEMENT AND NONVOLATILE MEMORY DEVICE

(71) Applicant: Panasonic Intellectual Property Management Co., Ltd., Osaka (JP)

(72) Inventors: Zhiqiang Wei, Osaka (JP); Takeshi Takagi, Kyoto (JP); Satoru Mitani, Osaka (JP); Shunsaku Muraoka, Osaka (JP); Koji Katayama, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 36 days.

(21) Appl. No.: 13/991,787

(22) PCT Filed: Oct. 3, 2012

(86) PCT No.: PCT/JP2012/006368
§ 371 (c)(1),
(2) Date: Jun. 5, 2013

(87) PCT Pub. No.: WO2013/051267
PCT Pub. Date: Apr. 11, 2013

(65) Prior Publication Data
US 2013/0250658 A1 Sep. 26, 2013

(30) Foreign Application Priority Data

Oct. 6, 2011 (JP) ................ 2011-222247

(51) Int. Cl.
*G11C 11/00* (2006.01)
*G11C 13/00* (2006.01)
(Continued)

(52) U.S. Cl.
CPC .......... *G11C 13/004* (2013.01); *G11C 13/0007* (2013.01); *G11C 13/0061* (2013.01);
(Continued)

(58) Field of Classification Search
USPC ...................... 365/148, 163; 257/4
See application file for complete search history.

(56) References Cited

U.S. PATENT DOCUMENTS 6,473,332 B1 10/2002 Ignatiev et al.
7,521,704 B2 4/2009 Lee et al.
(Continued)

FOREIGN PATENT DOCUMENTS

JP 2005-317976 11/2005
JP 2007-180202 7/2007
(Continued)

OTHER PUBLICATIONS

International Search Report issued Dec. 11, 2012 in corresponding International Application No. PCT/JP2012/006368.
(Continued)

*Primary Examiner* — Harry W Byrne
*Assistant Examiner* — Lance Reidlinger
(74) *Attorney, Agent, or Firm* — Wenderoth, Lind & Ponack, L.L.P.

(57) ABSTRACT

A nonvolatile memory device includes: a first electrode; a second electrode; and a variable resistance layer which includes: a first oxide layer including a first metal oxide; a second oxide layer located between and in contact with the first oxide layer and a second electrode including a second metal oxide and having a degree of oxygen deficiency lower than a degree of oxygen deficiency of the first oxide layer; and a local region located in the first oxide layer and the second oxide layer, having contact with the second electrode and no contact with the first electrode, and having a degree of oxygen deficiency higher than the degree of oxygen deficiency of the second oxide layer and different from the degree of oxygen deficiency of the first oxide layer.

13 Claims, 24 Drawing Sheets

(51) Int. Cl.
*H01L 45/00* (2006.01)
*H01L 27/24* (2006.01)

(52) U.S. Cl.
CPC ........ *G11C13/0064* (2013.01); *G11C 13/0069* (2013.01); *H01L 27/2409* (2013.01); *H01L 27/2463* (2013.01); *H01L 45/08* (2013.01); *H01L 45/1233* (2013.01); *H01L 45/1253* (2013.01); *H01L 45/146* (2013.01); *G11C 2213/55* (2013.01); *G11C 2213/72* (2013.01); *G11C 2213/79* (2013.01)

(56) References Cited

U.S. PATENT DOCUMENTS

| | | | |
|---|---|---|---|
| 7,639,521 B2 * | 12/2009 | Baek et al. | 365/148 |
| 7,760,545 B2 | 7/2010 | Nakai | |
| 7,796,416 B2 | 9/2010 | Ishihara et al. | |
| 7,869,258 B2 * | 1/2011 | Scheuerlein et al. | 365/148 |
| 7,894,239 B2 | 2/2011 | Tamai et al. | |
| 8,022,502 B2 | 9/2011 | Kanzawa et al. | |
| 8,054,674 B2 | 11/2011 | Tamai et al. | |
| 8,309,946 B2 | 11/2012 | Mitani et al. | |
| 2005/0247921 A1 | 11/2005 | Lee et al. | |
| 2008/0149912 A1 | 6/2008 | Nakai | |
| 2009/0097300 A1 | 4/2009 | Ishihara et al. | |
| 2009/0147558 A1 | 6/2009 | Tamai et al. | |
| 2009/0283736 A1 | 11/2009 | Kanzawa et al. | |
| 2010/0172170 A1 | 7/2010 | Tamai et al. | |
| 2011/0001109 A1 | 1/2011 | Ninomiya et al. | |
| 2011/0031465 A1 | 2/2011 | Mitani et al. | |
| 2011/0294259 A1 | 12/2011 | Kanzawa et al. | |
| 2012/0120712 A1 | 5/2012 | Kawai et al. | |
| 2013/0001504 A1 * | 1/2013 | Ninomiya et al. | 257/4 |

FOREIGN PATENT DOCUMENTS

| | | |
|---|---|---|
| JP | 2008-181633 | 8/2008 |
| JP | 2008-306157 | 12/2008 |
| JP | 2009-141225 | 6/2009 |
| JP | 4592828 | 12/2010 |
| JP | 4705202 | 6/2011 |
| JP | 4960537 | 6/2012 |
| WO | 2008/142919 | 11/2008 |
| WO | 2008/149484 | 12/2008 |
| WO | 2010/086916 | 8/2010 |
| WO | 2010/090002 | 8/2010 |
| WO | 2010/143396 | 12/2010 |
| WO | 2012/066787 | 5/2012 |
| WO | WO2012066787 A1 * | 5/2012 |

OTHER PUBLICATIONS

Rainer Waser et al., "Redox-Based Resistive Switching Memories—Nanoionic Mechanisms, Prospects, and Challenges," Advanced Materials, vol. 21, No. 25-26, pp. 2632-2663, Jul. 2009.

J. McPherson et al., "Proposed Universal Relationship Between Dielectric Breakdown and Dielectric Constant", 2002 IEEE International Electron Devices Meeting (IEDM), Dec. 8-11, 2002, pp. 633-636.

* cited by examiner

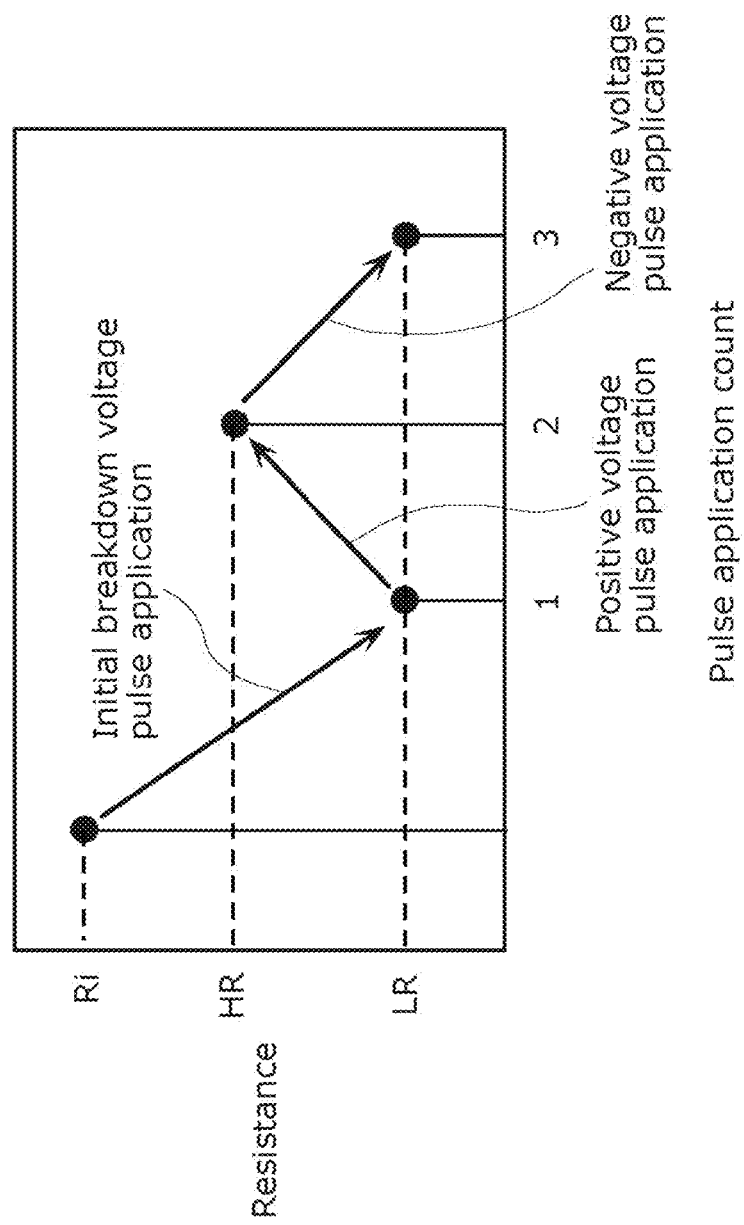

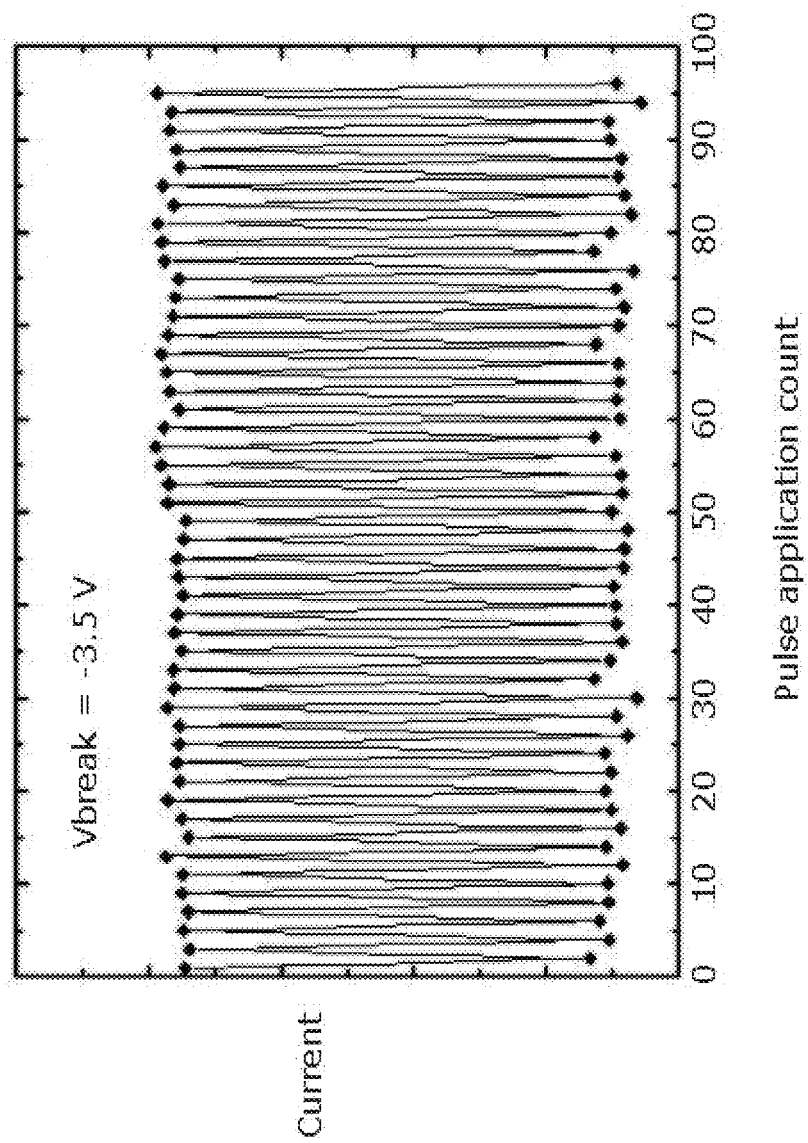

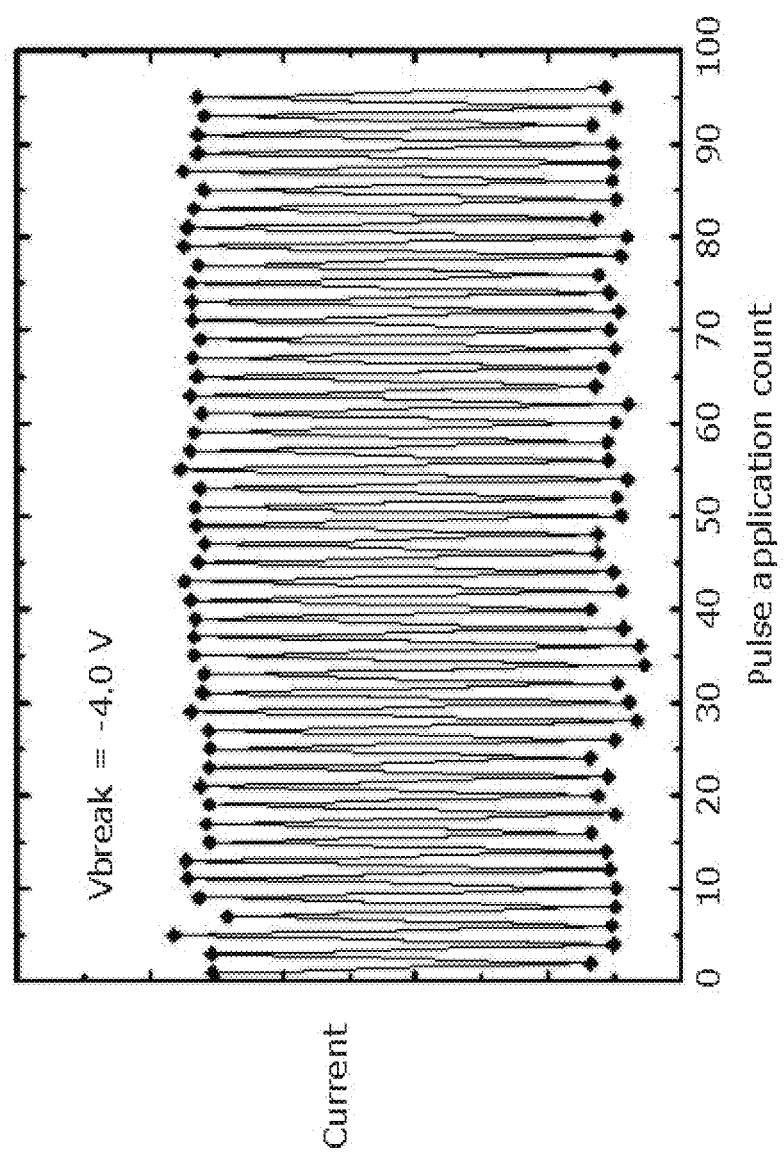

NONVOLATILE MEMORY ELEMENT AND NONVOLATILE MEMORY DEVICE

TECHNICAL FIELD

The present invention relates to nonvolatile memory elements, and particularly to a variable resistance nonvolatile memory element having resistance which reversibly changes according to an electrical signal applied thereto, and a nonvolatile memory device including the nonvolatile memory element.

BACKGROUND ART

In recent years, demand for high-capacity non volatile memory devices for storage of data of music, pictures, and other information has been increasing with progress of digital technology for electric appliances. A notable means to meet this demand is a resistance random access memory device (hereinafter referred to as a ReRAM). A ReRAM includes memory cells which are nonvolatile memory elements each having resistance changeable according to an electrical signal applied thereto and thereafter retained. This notability is due to characteristics of the nonvolatile memory element, such as its structure which is so simple that density can be easily increased, and which is compatible with conventional semiconductor processes.

Such nonvolatile memory elements are categorized into two major types according to materials for variable resistance layers (variable resistance material). A variable resistance nonvolatile memory element of one type includes a perovskite-based material disclosed in, for example, Patent Literature (PTL) 1, such as $Pr_{1-x}Ca_xMnO_3$ (PCMO), $La_{1-x}Sr_xMnO_3$ (LSMO), or $GdBaCo_xO_y$ (GBCO), as a variable resistance material.

A variable resistance nonvolatile memory element of the other type includes a binary transition metal oxide as a variable resistance material. Compared to the perovskite-based material, composition and structure of binary transition metal oxides are so simple that composition control and film formation in manufacturing can be easily performed. Furthermore, binary transition metal oxides advantageously have rather favorable compatibility with semiconductor processes, and thus there has been considerable research on binary transition metal oxides.

Although much about the mechanism of resistance change still remains unknown, recent researches have found that a likely cause of such resistance change is change in defect density of conductive filaments formed in a binary transition metal oxide by an oxidation-reduction reaction (for example, see PTL 2 and Non Patent Literature (NPL) 1).

FIG. 17 is a cross-sectional view showing a configuration of a conventional nonvolatile memory element 1400 disclosed in PTL 2.

The nonvolatile memory element 1400 initially has a structure in which a variable resistance layer 1405 including a transition metal oxide is located between a first electrode 1403 and a second electrode 1406 ((a) in FIG. 17). Then, a voltage (initial breakdown voltage) is applied between the first electrode 1403 and the second electrode 1406, so that a filament 1405c is formed which serves as a current path between the first electrode 1403 and the second electrode 1406 (that is, a portion where a current flowing between the first electrode 1403 and the second electrode 1406 locally has a higher density) ((b) in FIG. 17).

CITATION LIST

Patent Literature

PTL 1

Description of U.S. Pat. No. 6,473,332

PTL 2

Japanese Unexamined Patent Application Publication No. 2008-306157

NPL 1

R. Waser et al., Advanced Materials, No. 21, 2009, pp. 2632-2663

SUMMARY OF INVENTION

Technical Problem

The conventional nonvolatile memory elements including the above-described transition metal oxide as a variable resistance material have been desired to have smaller variation in variable resistance characteristics. Elaborate studies of the conventional nonvolatile memory elements have led the inventors to the following problem with the conventional variable resistance elements.

The conventional nonvolatile memory elements including a transition metal oxide have variable resistance after filaments are formed in their variable resistance layers by application of initial breakdown voltage. The filaments formed in the variable resistance layers penetrate through the variable resistance layers to connect between a first electrode and a second electrode.

Variable resistance elements including such filaments show large variations in resistance of variable resistance layers when resistance changes, and thus have a problem of large variations in resistance change characteristics.

The present invention, conceived to address the problem, has an object of providing nonvolatile memory elements having smaller differences in resistance change characteristics and such nonvolatile memory devices.

Solution to Problem

In order to solve the problem with the conventional technique, provided is a nonvolatile memory element according to an aspect of the present invention which includes: a first electrode; a second electrode; and a variable resistance layer interposed between the first electrode and the second electrode and capable of reversibly switching between a high resistance state and a low resistance state based on a polarity of a voltage applied between the first electrode and the second electrode, wherein the variable resistance layer includes: a first oxide layer comprising a first metal oxide; a second oxide layer located between and in contact with the first oxide layer and the second electrode, comprising a second metal oxide, and having a degree of oxygen deficiency lower than a degree of oxygen deficiency of the first oxide layer; and a local region located in the first oxide layer and the second oxide layer, having contact with the second electrode and no contact with the first electrode, and having a degree of oxygen deficiency higher than a degree of oxygen deficiency of the second oxide layer and different from the degree of oxygen deficiency of the first oxide layer.

Advantageous Effects of Invention

According to the present invention, resistance change is controlled in a local region so that nonvolatile memory elements have smaller variation in resistance change characteristics. In addition, use of the nonvolatile memory elements makes it possible to provide miniaturized nonvolatile memory devices and higher-capacity nonvolatile memory devices.

BRIEF DESCRIPTION OF DRAWINGS

FIG. 4 shows exemplary operation of a nonvolatile memory element according to Embodiment 1 of the present invention.

FIG. 5B shows dependency of resistance changes of a nonvolatile memory element according to Embodiment 1 of the present invention for the count of application of voltage pulses on initial breakdown voltage. The nonvolatile memory element has a variable resistance layer including an oxygen-deficient tantalum oxide and a first electrode and a second electrode both including Pt.

FIG. 5C shows dependency of resistance changes of a nonvolatile memory element according to Embodiment 1 of the present invention for the count of application of voltage pulses on initial breakdown voltage. The nonvolatile memory element has a variable resistance layer including an oxygen-deficient tantalum oxide and a first electrode and a second electrode both including Pt.

DESCRIPTION OF EMBODIMENTS

Figure 1:
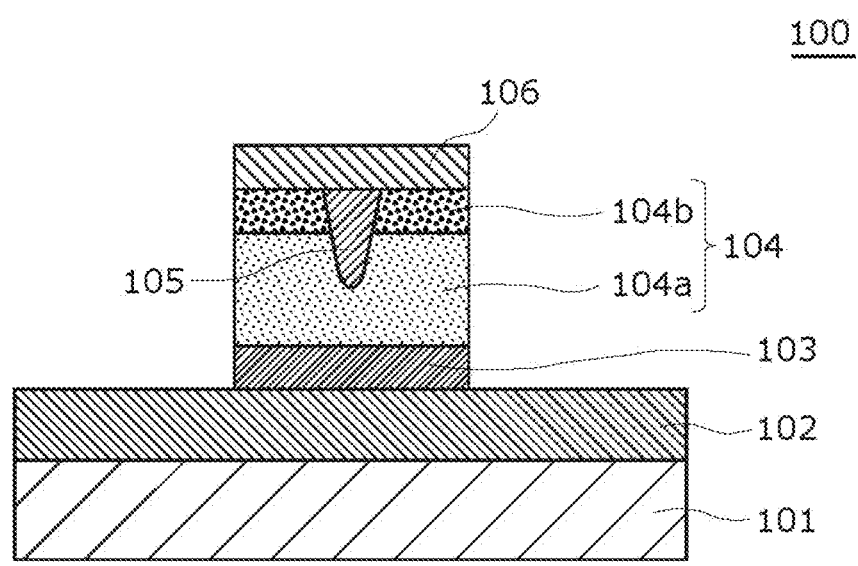
FIG. 1 is a cross-sectional view showing an exemplary configuration of a nonvolatile memory element according to Embodiment 1 of the present invention.

A nonvolatile memory element according to an aspect of the present invention includes: a first electrode; a second electrode; and a variable resistance layer interposed between the first electrode and the second electrode and capable of reversibly switching between a high resistance state and a low resistance state based on a polarity of a voltage applied between the first electrode and the second electrode, wherein the variable resistance layer includes: a first oxide layer comprising a first metal oxide; a second oxide layer located between and in contact with the first oxide layer and the second electrode, comprising a second metal oxide, and having a degree of oxygen deficiency lower than a degree of oxygen deficiency of the first oxide layer; and a local region located in the first oxide layer and the second oxide layer, having contact with the second electrode and no contact with the first electrode, and having a degree of oxygen deficiency higher than a degree of oxygen deficiency of the second oxide layer and different from the degree of oxygen deficiency of the first oxide layer.

In this configuration, more specifically, in a configuration in which the local region is less thick than the variable resistance layer, initial breakdown voltage can be low and resistance can be changed by applying a lower voltage. Furthermore, since the local region has no contact with the first electrode, change in parasitic resistance due to influence of the first electrode can be reduced and thereby variation in resistance change characteristics can be reduced.

The local region may include: a first local region located in the first oxide layer, having no contact with the first electrode, and having a degree of oxygen deficiency higher than the degree of oxygen deficiency of the first oxide layer; and a second local region located between the first local region and the second electrode, having contact with the first local region and the second electrode, and having a degree of oxygen deficiency lower than the degree of oxygen deficiency of the first local region and higher than the degree of oxygen deficiency of the second oxide layer.

Furthermore, the switching of the variable resistance layer between the high resistance state and the low resistance state may occur in the second local region.

Furthermore, the second local region may have a portion less thick than the second oxide layer in a direction from the first electrode to the second electrode.

Furthermore, the metal oxides included in the second oxide layer and the first oxide layer may be oxides of a same metal.

Furthermore, the same metal may be Ta.

Furthermore, the first electrode and the second electrode may comprise a same material.

Furthermore, the variable resistance nonvolatile memory element may further comprise a load element electrically connected to the variable resistance layer.

Furthermore, the load element may be one of a fixed resistor, a transistor, and a diode.

Furthermore, the local region formed in the variable resistance layer may be a single local region in the variable resistance layer.

Furthermore, a nonvolatile memory device according to an aspect of the present invention includes: a substrate; a plurality of first lines formed in parallel with each other on the substrate; a plurality of second lines formed in parallel with each other in a plane above the plurality of first lines and three-dimensionally crossing the plurality of first lines, the plane being parallel with a main surface of the substrate; a memory cell array including nonvolatile memory elements each of which is the nonvolatile memory element according to any one of claims 1 to 10 and is provided to a corresponding one of three-dimensional crosspoints between the plurality of first lines and the plurality of second lines; a selection circuit which selects at least one nonvolatile memory element from among the nonvolatile memory elements included in the memory cell array; a write circuit which writes data to the nonvolatile memory element selected by the selection circuit, by applying a voltage to the nonvolatile memory element selected by the selection circuit; and a read circuit which reads data by detecting a resistance of the nonvolatile memory element selected by the selection circuit.

The nonvolatile memory device in this configuration has a less varied resistance change characteristics.

Furthermore, the nonvolatile memory element may include a current steering element electrically connected to the variable resistance layer.

Furthermore, a nonvolatile memory device according to an aspect of the present invention includes: a substrate; a memory cell array including: a plurality of word lines and a plurality of bit lines formed above the substrate; a plurality of transistors each connected to a corresponding one of the word lines and a corresponding one of the bit lines; a plurality of nonvolatile memory elements each of which is the nonvolatile memory element according to any one of Claims 1 to 10 and is provided to a corresponding one of the transistors on a one-to-one basis; a selection circuit which selects at least one nonvolatile memory element from among the nonvolatile memory elements included in the memory cell array; a write circuit which writes data to the nonvolatile memory element selected by the selection circuit, by applying a voltage to the selected nonvolatile memory element; and a read circuit which reads data by detecting a resistance of the nonvolatile memory element selected by the selection circuit.

The nonvolatile memory device in this configuration has a less varied resistance change characteristics.

According to the present invention, resistance change is controlled in a local region so that nonvolatile memory elements have smaller variation in resistance change characteristics. In addition, use of the nonvolatile memory elements makes it possible to provide miniaturized nonvolatile memory devices and higher-capacity nonvolatile memory devices.

Embodiments of the present invention shall be described below with reference to the drawings.

It should be noted that elements having substantially the same configurations, functions, and effects are denoted with the same reference signs in the drawings, and thus detailed description thereof is omitted. It should be also noted that numerical values, materials, methods of forming films, and others described below are all given for illustrative purposes to concretely describe embodiments of the present invention and are not intended to limit the present invention. It should be also noted that the connections between constituent elements described below are all given for illustrative purposes to concretely describe embodiments of the present invention and are not intended to limit connections to provide the features of the present invention. The scope of the present invention is limited only by the claims. Thus, among the constituent elements in the following embodiments, a constituent element not included in the independent claim reciting the most generic part of the concept of the present invention is not always necessary for the present invention to solve the problem but shall be described as a constituent element of a preferable embodiment.

Embodiment 1

Configuration of Nonvolatile Memory Element

FIG. 1 is a cross-sectional view showing an exemplary configuration of a nonvolatile memory element according to Embodiment 1 of the present invention.

A nonvolatile memory element 100 in Embodiment 1 includes a substrate 101, an interlayer insulating film 102 formed on the substrate 101, and a first electrode 103, a second electrode 106, and a variable resistance layer 104 formed above the interlayer insulating film 102. The variable resistance layer 104 is located between the first electrode 103 and the second electrode 106.

The variable resistance layer 104 is interposed between the first electrode 103 and the second electrode 106 and has resistance which reversibly changes according to an electrical signal provided between the first electrode 103 and the second electrode 106. For example, the variable resistance layer 104 reversibly switches between a high resistance state and a low resistance state according to the polarity of a voltage applied between the first electrode 103 and the second electrode 106.

The variable resistance layer 104 has a layered structure including at least two layers of a first oxide layer 104a and a second oxide layer 104b, and includes a local region 105 in the first oxide layer 104a and second oxide layer 104b. The first oxide layer 104a connects to the first electrode 103. The second oxide layer 104b is formed on the first oxide layer 104a and connects to the second electrode 106. The local region 105 has contact with the second electrode 106 but has no contact with the first electrode 103. At least part of the local region 105 is formed in the second oxide layer 104b. The degree of oxygen deficiency of the local region 105 reversibly changes upon application of an electrical pulse. It is conceivable that the local region 105 includes a filament composed of oxygen defect sites.

It is also conceivable that change in resistance of the variable resistance layer 104 having a layered structure is change in the resistance value of the local region 105 caused by change in the filament (conduction path) in the local region 105 due to an oxidation-reduction reaction inside the local region 105, which is very small.

More specifically, when a positive voltage is applied to the second electrode 106 with respect to the first electrode 103, oxygen ions in the variable resistance layer 104 are attracted toward the second metal oxide layer 104b. This causes an oxidation reaction in the small local region 105, and thereby the degree of oxygen deficiency is reduced. As a result, the filament inside the local region 105 becomes less conductive and the resistance value of the local region 105 increases.

In contrast, when a negative voltage is applied to the second electrode 106 with respect to the first electrode 103, oxygen ions in the second oxide layer 104b are driven toward the first oxide layer 104a. This causes a reduction reaction in the small local region 105 formed in the second oxide layer 104b, and thereby the degree of oxygen deficiency is increased. As a result, the filament inside the local region 105 becomes more conductive and the resistance value of the local region 105 decreases.

The variable resistance layer 104 has a layered structure of the first oxide layer 104a and the second oxide layer 104b. The first oxide layer 104a includes an oxygen-deficient first metal oxide. The second oxide layer 104b includes a second metal oxide which is less oxygen-deficient than the first metal oxide. Accordingly, the second oxide layer 104b has a degree of oxygen deficiency lower than the degree of oxygen deficiency of the first oxide layer. The second oxide layer 104b therefore has a resistance value higher than the resistance value of the first oxide layer 104a.

In other words, the variable resistance layer 104 has a layered structure of at least the first oxide layer 104a including the first metal oxide and a second oxide layer 104b including the second metal oxide. The first oxide layer 104a is located between the first electrode 103 and the second oxide layer 104b. The second oxide layer 104b is located between the first oxide layer 104a and the second electrode 106. The second oxide layer 104b may be less thick than the first oxide layer 104a. In this case, it is easy to structure the variable resistance layer 104 in which the local region 105 has no contact with the first electrode 103. The local region 105 will be described later. Since the second oxide layer 104b has a resistance value higher than the resistance value of the first oxide layer 104a, an electric field applied to the variable resistance layer 104 is likely to localize in the second oxide layer 104b.

It should be noted that the "degree of oxygen deficiency" in the present Description refers to a rate of deficiency in oxygen of a metal oxide to stoichiometric composition of the metal oxide (when a plurality of stoichiometric ratios is applicable to the metal oxide, stoichiometric composition which provides the metal oxide with the highest resistance value). A metal oxide of stoichiometric composition is more stable and has a higher resistance value than the metal oxide of non-stoichiometric composition.

For example, in the case of tantalum (Ta), which is a metal, the oxide of stoichiometric composition according to the above definition is $Ta_2O_5$, and this can be also expressed as $TaO_{2.5}$. The degree of oxygen deficiency of $TaO_{2.5}$ is 0%. The degree of oxygen deficiency of $TaO_{1.5}$ is (2.5−1.5)/2.5, that is, 40%. The degree of oxygen deficiency of a metal oxide in excess of oxygen is represented as a negative value. Each degree of oxygen deficiency in the present Description may have one of a positive value, a zero value, and a negative value unless otherwise noted.

An oxide having a lower degree of oxygen deficiency is closer to the oxide of stoichiometric composition and therefore has a higher resistance value, and an oxide having a higher degree of oxygen deficiency is closer to the metal included in the oxide and therefore has a lower resistance value.

It should be also noted that a term "oxygen content atomic percentage" may be used in the present Description instead of the term "degree of oxygen deficiency" when the metal included in the first oxide layer 104a and the metal included in the second oxide layer 104b are the same. A "higher oxygen content atomic percentage" corresponds to a "lower degree of oxygen deficiency", and a "lower oxygen content atomic percentage" corresponds to a "higher degree of oxygen deficiency". It should be understood, however, that the variable resistance layer 104 according to Embodiment 1 is not limited to the case in which the metal included in the first oxide layer 104a and the metal included in the second oxide layer 104b are the same. This will be described later in the present Description.

The "oxygen content atomic percentage" is the ratio of the number of oxygen atoms to the total number of atoms. For example, the oxygen content atomic percentage of $Ta_2O_5$ is the ratio of the number of oxygen atoms to the total number of atoms (O/(Ta+O)), that is, 71.4 atm %. Accordingly, oxygen-deficient tantalum oxide has an oxygen content atomic percentage greater than 0 atm % and smaller than 71.4 atm %. For example, when the first metal included in the first oxide layer 104a and the second metal included in the second oxide layer 104b are the same, the oxygen content atomic percentages and the degree of oxygen deficiency correspond to each other such that when the second metal oxide has an oxygen content atomic percentage larger than the oxygen content atomic percentage of the first metal oxide, the second metal oxide has a degree of oxygen deficiency lower than the degree of oxygen deficiency of the first metal oxide.

The variable resistance layer 104 includes the local region 105 in the vicinity of the interface between the first oxide layer 104a and the second oxide layer 104b. The local region 105 has a degree of oxygen deficiency which is higher than the degree of oxygen deficiency of the second oxide layer 104b and different from the degree of oxygen deficiency of the first oxide layer 104a.

The local region 105 is formed by applying an initial breakdown voltage to the variable resistance layer 104 having a layered structure of the first oxide layer 104a and the second oxide layer 104b. The initial breakdown voltage may be a low voltage as will be described later in the present Description. Initial breakdown is performed to form a local region 105 which is in contact with the second electrode 106, penetrates through the second oxide layer 104b to cut partway into the first oxide layer 104a. The local region 225 thus has no contact with the first electrode 103.

In the present Description, the local region refers to a part of the variable resistance layer 104 in which a current dominantly flows when a voltage is applied between the first electrode 103 and the second electrode 106. The local region 105 also means a region including a group of filaments (conduction paths) formed in the variable resistance layer 104. In other words, change in the resistance of the variable resistance layer 104 occurs in the local region 105. Thus, when a driving voltage is applied to the variable resistance layer 104 in the low resistance state, a current dominantly flows in the local region 105 including the filaments. Changing between the high resistance state and the low resistance state occurs in the local region 105 of the variable resistance layer 104.

The local region 105 may be a small portion such that the lower end of the local region 105 has no contact with the first electrode 103. Reduction of the local region 105 in size reduces variation in resistance change. However, the local region 105 needs to be large enough to securely include filaments (conduction paths) to allow a current to flow.

Figure 2A:
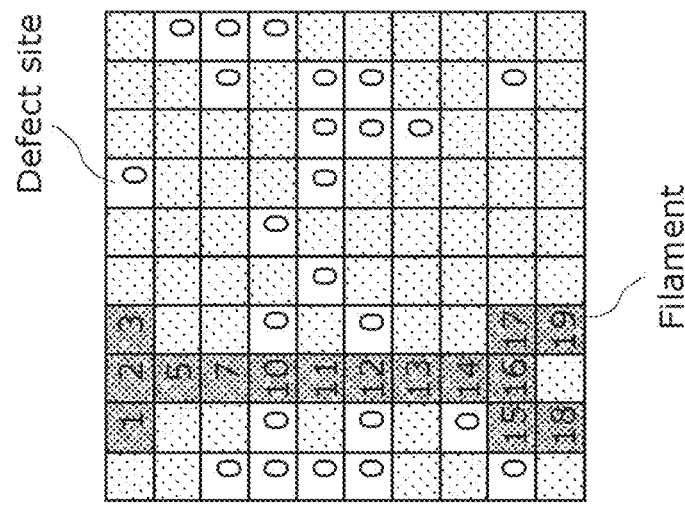
FIG. 2A shows formation of a filament in a local region.
Figure 2B:
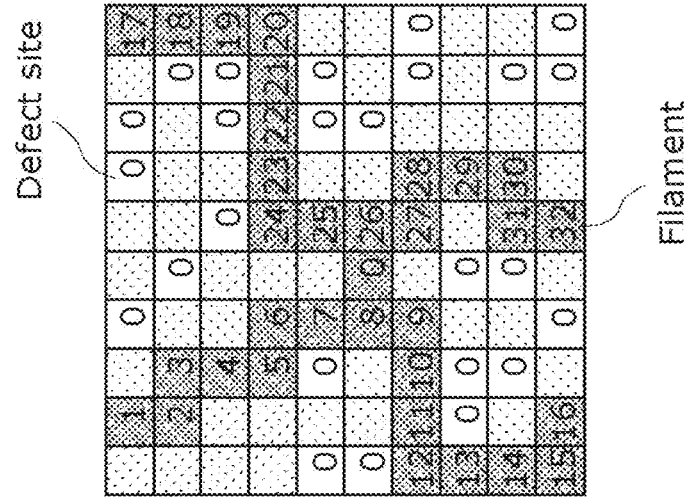
FIG. 2B shows formation of a filament in a local region.
Figure 2C:
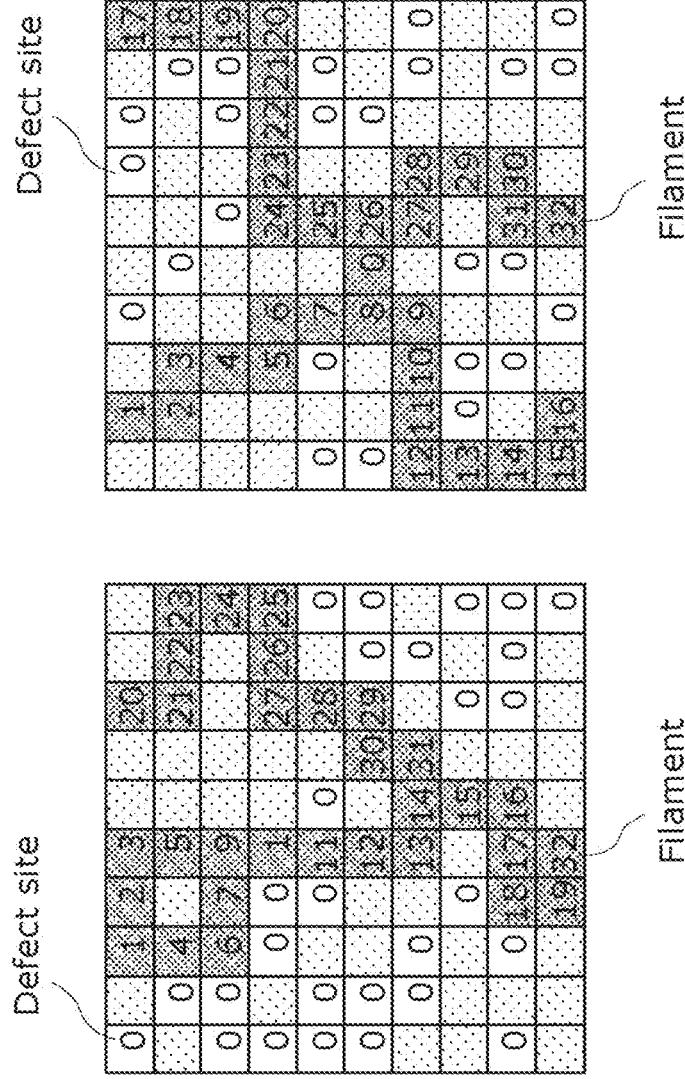
FIG. 2C shows formation of a filament in a local region.

FIG. 2A to FIG. 2C illustrate formation of a filament in the local region 105 by showing a result of simulation using a percolation model. It is assumed here that oxygen-defect sites in the local region 105 connect to each other to form a filament (conduction path). The percolation model is based on a theory that when oxygen-defect sites (hereinafter simply referred to as defect sites) are randomly distributed in the local region 105 and the density of the defect sites exceeds a threshold, a connection between the defect sites is formed with an increased probability. The metal oxide therein includes metal ions and oxygen ions. The "defect" means lack of oxygen of the metal oxide compared to the metal oxide of stoichiometric composition. The "density of defect sites" corresponds to the degree of oxygen deficiency. The higher the degree of oxygen deficiency is, the higher the density of defect sites is.

In this model, approximate sites of oxygen ions in the variable resistance layer 104 are assumed as sections (hereinafter referred to as sites) in a lattice, and filaments formed by connections of stochastically-formed defect sites (sites lacking oxygen ions) are simulated. The sites labeled as "0" in FIG. 2A to FIG. 2C represent defect sites formed in the local region 105. The cluster (aggregation of mutually connected defect sites) of the thickly dotted sites (the sites labeled as any number other than "0") represents filaments or a current path formed in the local region 105 by applying a voltage in the top-bottom direction of each diagram. The thinly-dotted sites (the sites with no numerical label) represent sites occupied by oxygen ions and having a high resistance. As shown in FIG. 2A to FIG. 2C, the defect sites are randomly distributed in the local region 105 and the cluster of defect sites connected from the top to the bottom includes a group of filaments, which allows a current to flow between the upper surface and the lower surface of the local region 105. The number and the shape of the filaments are stochastically determined based on the percolation model. Distributions of the number and the shape of the filaments correspond to distribution of resistance values in the variable resistance layer 104.

The local region 105 may be formed as an only local region in each variable resistance layer 104 of the nonvolatile memory element 100. With this, variation in resistance between the nonvolatile memory elements 100 can be reduced. The number of local regions 105 formed in the variable resistance layer 104 can be obtained by electron beam absorbed current (EBAC) analysis.

To drive the nonvolatile memory element 100, a voltage satisfying a predetermined condition is applied between the first electrode 103 and the second electrode 106 from an external power supply. The resistance of the variable resistance layer 104 of the nonvolatile memory element 100 reversibly increases or decreases according to the value and polarity of the applied voltage. For example, when the applied pulse voltage has a predetermined polarity and an amplitude larger than the amplitude of a predetermined threshold voltage, the resistance of the variable resistance layer 104 increases or decreases. Such voltage may be hereinafter referred to as "write voltage". In contrast, when the applied pulse voltage has an amplitude smaller than the amplitude of the threshold voltage, the resistance of the variable resistance layer 104 remains the same. Such voltage may be hereinafter referred to as "read voltage".

The variable resistance layer 104 includes an oxygen-deficient metal oxide. The metal in the metal oxide may be at least one of aluminum (Al) or a transition metal such as tantalum (Ta), hafnium (Hf), titanium (Ti), zirconium (Zr), niobium (Nb), tungsten (W), nickel (Ni), or iron (Fe). Since each of the transition metals may form compounds in more than one oxidation states, different resistance states can be obtained by oxidation-reduction reaction. The term "oxygen-deficient metal oxide" refers to a metal oxide having an oxygen content atomic percentage (atomic proportion, the ratio of the number of oxygen atoms to the total number of atoms) lower than the oxygen content atomic percentage of the metal oxide of stoichiometric composition (this is typically an insulator). Many of the oxygen-deficient metal oxides typically exhibit semiconducting behavior. Use of such an oxygen-deficient metal oxide as a material for the variable resistance layer 104 enables the nonvolatile memory element 100 to show stable resistance change with high reproducibility.

Assume that a metal oxide included in the variable resistance layer 104 is hafnium oxide, for an example. The resistance of the variable resistance layer 104 can be stably and quickly changed when $0.9 \leq x \leq 1.6$ and $x<y$, where the composition of the first metal oxide is represented as $HfO_x$ and the composition of the second metal oxide is represented as $HfO_y$. In this case, the second metal oxide may have a thickness of 3 to 4 nm.

Assume that a metal oxide included in the variable resistance layer 104 is zirconium oxide, for an example. The resistance of the variable resistance layer 104 can be stably and quickly changed when $0.9 \leq x \leq 1.4$ and $x<y$, where the composition of the first metal oxide is represented as $ZrO_x$ and the composition of the second metal oxide is represented as $ZrO_y$. In this case, the second metal oxide may have a thickness of 1 to 5 nm.

Assume that the metal oxide included in the second oxide layer 104b and the metal oxide included in the first oxide layer 104a are oxides of the same metal and that the metal included in the variable resistance layer 104 is tantalum (Ta). In this case, conditions $0<x<2.5$ and $x<y$ may be satisfied where oxygen-deficient tantalum oxide included in the first oxide layer 104a is represented as $TaO_x$ and tantalum oxide included in the second oxide layer 104b is represented as TaO$_y$. To achieve stable resistance change, conditions 2.1≤y and 0.8≤x≤1.9 may be satisfied. Composition of each metal oxide layer can be measured by Rutherford back scattering spectroscopy.

The metal oxide included in the second oxide layer 104b and the metal oxide included in the first oxide layer 104a may be oxides of different metals. In other words, the first metal included in the first metal oxide, which is a material for the first oxide layer 104a, and the second metal included in the second metal oxide, which is a material for the second oxide layer 104b may be different metals. In this case, the second metal oxide may have a degree of oxygen deficiency lower than the degree of oxygen deficiency of the first metal oxide. In other words, the second metal oxide may have a resistance higher than the resistance of the first metal oxide. In this configuration, voltage applied between the first electrode 103 and the second electrode 106 to change resistance is distributed more to the second metal oxide than to the first metal oxide, so that oxidation-reduction reactions are likely to occur more in the second metal oxide.

Furthermore, when the first transition metal and the second transition metal are different materials, such materials may be used that the second transition metal have a standard electrode potential lower than the standard electrode potential of the first metal. The higher the standard electrode potential of a material is, the more difficult to oxidize the material is. Accordingly, the second metal oxide having a relatively low standard electrode potential is more easily subjected to oxidation-reduction reactions. It is conceivable that a resistance change is change in the resistance value (the degree of oxygen deficiency) of the local region 105 caused by change in filaments (conduction paths) in the local region 105 due to oxidation-reduction reactions inside the small local region 105 formed in the second metal oxide having a higher resistance.

For example, a stable resistance change is achieved when an oxygen-deficient tantalum oxide is used as the first metal oxide and a high-resistance titanium oxide (for example, TiO$_2$) is used as the second metal oxide. Titanium is a material having a standard electrode potential of −1.63 eV, which is lower than the standard electrode potential of the tantalum (−0.6 eV). When the second metal oxide has a standard electrode potential lower than the standard electrode potential of the first metal oxide as in this case, oxidation-reduction reactions are likely to occur more in the second metal oxide. In another possible combination, aluminum oxide (Al$_2$O$_3$) may be used as the second metal oxide to be included in a higher-resistance layer. For example, the first metal oxide may be an oxygen-deficient tantalum oxide (TaO$_x$) and the second metal oxide may be aluminum oxide (Al$_2$O$_3$). A material having a higher standard electrode potential is more difficult to oxidize. Titanium included in the second oxide layer 104b has a standard electrode potential lower than the standard electrode potential of tantalum included in the first oxide layer 104a. Accordingly, the second oxide layer 104b is more easily subjected to oxidation-reduction reactions than the first oxide layer 104a, and thereby the resistance of the variable resistance element changes more easily.

The second oxide layer 104b may have a permittivity higher than the relative permittivity of the first oxide layer 104a. In other words, the second oxide layer 104b may have a band gap smaller than the band gap of the first oxide layer 104a. For example, TiO$_2$ has a relative permittivity of 95, which is higher than the relative permittivity of Ta$_2$O$_5$ (26). Moreover, TiO$_2$ has a band gap of 3.1 eV, which is smaller than the band gap of Ta$_2$O$_5$ (4.4 eV). Generally, a material having a higher relative permittivity can be more easily broken down than a material having a lower relative permittivity, and a material having a smaller band gap can be more easily broken down than a material having a larger band gap. Initial breakdown voltage can be thus lowered when TiO$_2$ is used as a material for the second oxide layer 104b.

Initial breakdown voltage can be thus lowered when a metal oxide satisfying either or both of the above conditions is used as a material for the second oxide layer 104b to make the breakdown strength of the second oxide layer 104b lower than the breakdown strength of the first oxide layer 104a. This is because the breakdown strength of oxide layers and relative permittivity are correlative such that the higher the relative permittivity is, the lower the breakdown strength is as shown in FIG. 1 in J. McPherson et al., IEDM 2002, pp. 633-636. This is also because the breakdown strength of oxide layers and band gaps are correlative such that the higher the band gap is, the higher the breakdown strength is as shown in FIG. 2 in J. McPherson et al., IEDM 2002, pp. 633-636.

Examples of materials for the first electrode 103 and the second electrode 106 include platinum (Pt), iridium (Ir), palladium (Pd), silver (Ag), nickel (Ni), tungsten (W), copper (Cu), aluminum (Al), tantalum (Ta), titanium (Ti), titanium nitride (TiN), tantalum nitride (TaN), and titanium nitride aluminum (TiAlN).

More specifically, a material for the second electrode 106 connected to the second metal oxide having a lower degree of oxygen deficiency may be platinum (Pt), iridium (Ir), or palladium (Pd), which has a high standard electrode potential compared to the metal included in the second metal oxide and the material for the first electrode 103. On the other hand, a material for the first electrode 103 connected to the first metal oxide having a higher degree of oxygen deficiency may be tungsten (W), nickel (Ni), tantalum (Ta), titanium (Ti), aluminum (Al), tantalum nitride (TaN), or titanium nitride (TiN), which has a low standard electrode potential compared to the metal included in the first metal oxide. The higher the standard electrode potential of a material is, the more difficult to oxidize the material is.

More specifically, there may be a relation that Vr2<V2 and a relation that V1<V2 among the standard electrode potential V2 of the second electrode 106, the standard electrode potential Vr2 of the metal included in the second metal oxide, the standard electrode potential Vr1 of the metal included in the first metal oxide, and the standard electrode potential V1 of the first electrode 103. In addition, there may be a relation that V2>Vr2 and a relation that Vr1≥V1 thereamong.

In the above configuration, the second metal oxide near the interface between the second electrode 106 and the second metal oxide is selectively subjected to an oxidation-reduction reaction, and thereby stable resistance change is achieved.

The first electrode 103 in Embodiment 1 does not affect change in resistance because the first electrode 103 has no contact with the local region 105. Thus, flexible options for a material for the first electrode 103 are offered when the local region 105 according to Embodiment 1 is provided. For example, the first electrode 103 and the second electrode 106 may be made of the same material. In this case, processing can be simplified by applying process conditions for the first electrode 103 also to the second electrode 106.

The substrate 101 is not limited to but may be a single-crystal silicon substrate or a semiconductor substrate. The variable resistance layer 104 can be formed on a substrate at a relatively low temperature. Thus, the variable resistance layer 104 may be formed on a resin material.

The nonvolatile memory element 100 may further include a load element, such as a fixed resistor, a transistor, or a diode, electrically connected to the variable resistance layer 104.

Operation of Nonvolatile Memory Element and Method of Manufacturing the Same

An exemplary method of manufacturing the nonvolatile memory element 100 according to Embodiment 1 will be described below with reference to FIG. 3A to FIG. 3D.

Figure 3A:
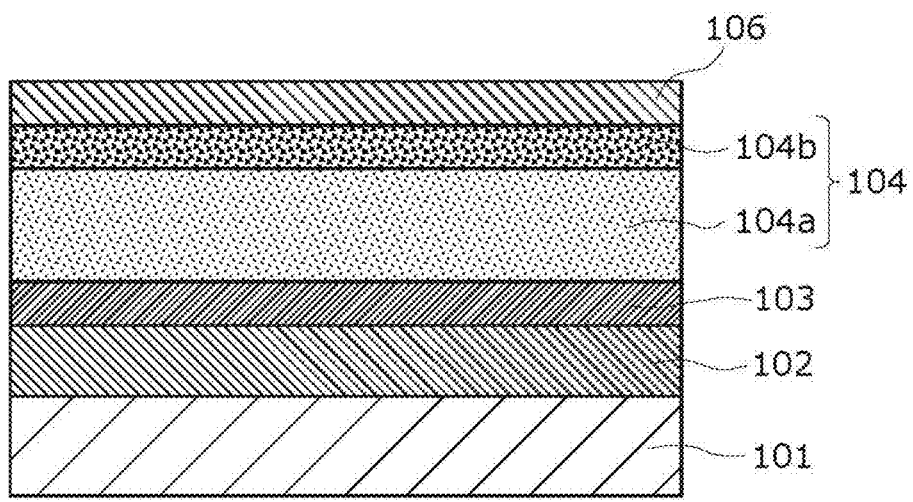
FIG. 3A is a cross-sectional view showing a process of forming a principal part of a nonvolatile memory element according to Embodiment 1 of the present invention.

First, the interlayer insulating film 102 having a thickness of 200 nm is formed on the substrate 101 which is, for example, a single-crystal silicon substrate by thermal oxidation as shown in FIG. 3A. Next, the first electrode 103 is formed on the interlayer insulating film 102 by sputtering. The first electrode 103 is, for example, a Pt thin film having a thickness of 100 nm. Optionally, an adhesive layer of Ti or TiN may be formed between the first electrode 103 and the interlayer insulating film 102 by sputtering. Next, the first oxide layer 104a, which is oxygen-deficient, is formed on the first electrode 103 by reactive sputtering using, for example, Ta as a sputtering target.

Next, the second oxide layer 104b is formed on the surface of the first oxide layer 104a by, for example, oxidatively reforming the surface of the first oxide layer 104a or by reactive sputtering using Ta as a sputtering target. The second oxide layer 104b has a degree of oxygen deficiency lower than the degree of oxygen deficiency of the first oxide layer 104a (that is, the second oxide layer 104b has a resistance higher than the resistance of the first oxide layer 104a). The first oxide layer 104a and the second oxide layer 104b are stacked in layers so that the variable resistance layer 104 has a layered structure.

The second oxide layer 104b may have a thickness from approximately 1 nm to 8 nm. This is because the second oxide layer 104 has too high an initial resistance when having an excessively large thickness, and has unstable resistance change when having an excessively small thickness.

Next, the second electrode 106 is formed on the second oxide layer 104b by sputtering. The second electrode 106 is, for example, a Pt thin film having a thickness of 150 nm.

Figure 3B:
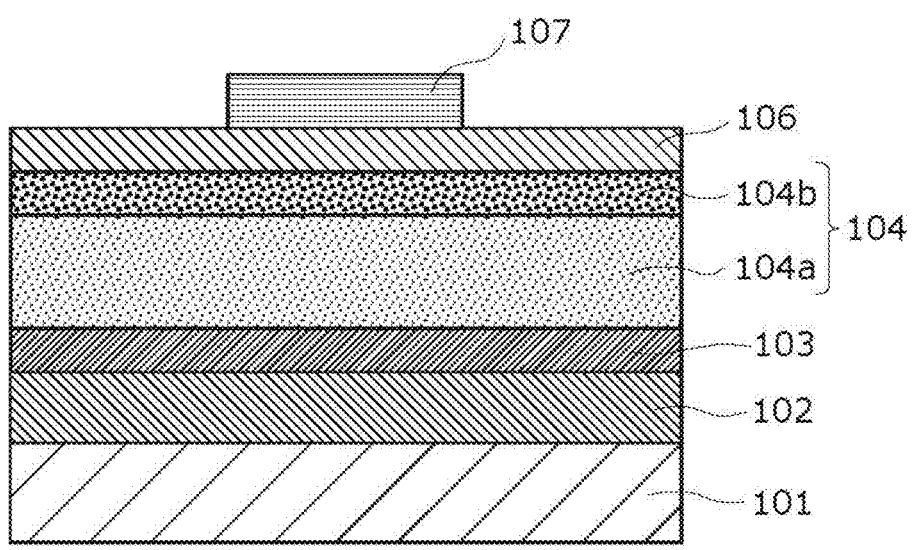
FIG. 3B is a cross-sectional view showing a process of forming the principal part of the nonvolatile memory element according to Embodiment 1 of the present invention.
Figure 3C:
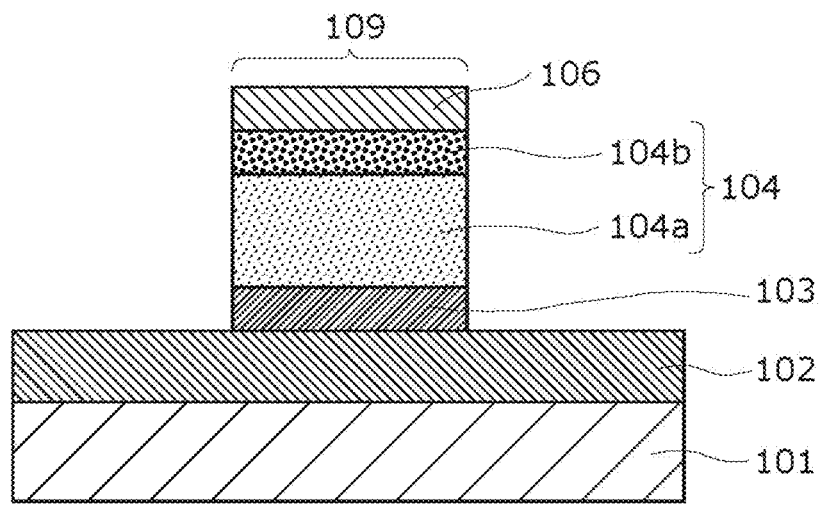
FIG. 3C is a cross-sectional view showing a process of forming the principal part of the nonvolatile memory element according to Embodiment 1 of the present invention.

Next, a photoresist pattern 107 is formed by photolithography as shown in FIG. 3B. Next, an element region 109 is formed by dry-etching using the photoresist pattern 107 as a mask as shown in FIG. 3C.

Figure 3D:
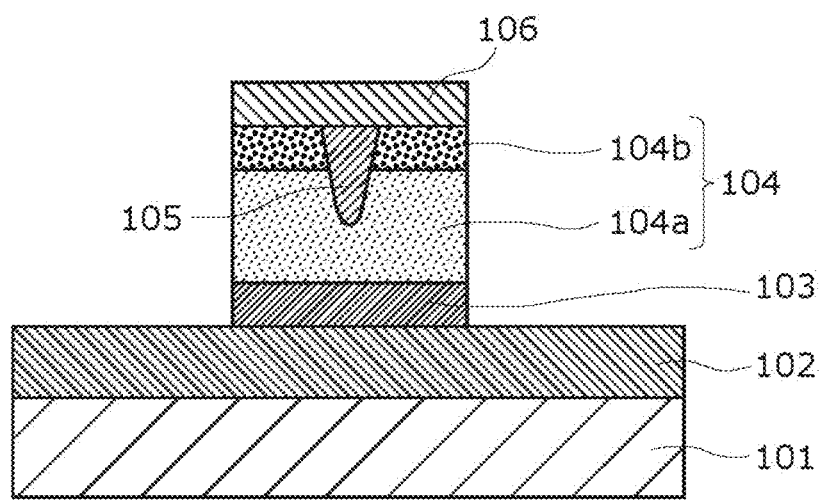
FIG. 3D is a cross-sectional view showing a process of forming the principal part of the nonvolatile memory element according to Embodiment 1 of the present invention.

Afterward, the local region 105 is formed in the variable resistance layer 104 by applying an initial breakdown voltage between the electrodes, that is, the first electrode 103 and the second electrode 106 as shown in FIG. 3D. An exemplary range of voltages to form the local region 105 will be described below using FIG. 4 to FIG. 6C.

A sample nonvolatile memory element used for the measurement illustrated in FIG. 4 to FIG. 6C has the first electrode 103, second electrode 106, and variable resistance layer 104 having dimensions of 0.5 μm×0.5 μm (area: 0.25 μm$^2$). Composition of the first oxide layer 104a is represented as TaO$_x$ (x=1.38), and composition of the second oxide layer 104b as TaO$_y$ (y=2.47). The variable resistance layer 104 has a thickness of 30 nm, the first oxide layer 104a has a thickness of 25 nm, and the second oxide layer 104b has a thickness of 5 nm. When a read voltage (for example, 0.4 V) is applied between the electrodes of the nonvolatile memory element 100, the initial resistance is approximately $10^7$ to $10^8 \Omega$.

The resistance status of the nonvolatile memory element 100 having an initial resistance (a resistance higher than a resistance HR in the high resistance state, for example, a resistance in a range from $10^7$ to $10^8 \Omega$) as shown in FIG. 4 is changed by applying an initial breakdown voltage between the electrodes. Subsequently, the resistance of the variable resistance layer 104 is changed as shown in FIG. 4 by alternately applying two types of voltage pulses as write voltage between the first electrode 103 and the second electrode 106 of the nonvolatile memory element 100. For example, the two types of voltage pulses have a pulse width of 100 ns and different polarities. More specifically, when a negative voltage pulse having a pulse width of 100 ns is applied as write voltage between the electrodes, resistance of the variable resistance layer 104 decreases from a high resistance HR to a low resistance LR. When a positive voltage pulse having a pulse width of 100 ns is applied as write voltage between the electrodes, resistance of the variable resistance layer 104 increases from the low resistance LR to the high resistance HR. It should be noted that the polarity of the voltage pulse in the present Description is positive when the potential of the second electrode 106 is higher than the potential of the first electrode 103, and negative when the potential of the second electrode 106 is lower than the potential of the first electrode 103.

Figure 5A:
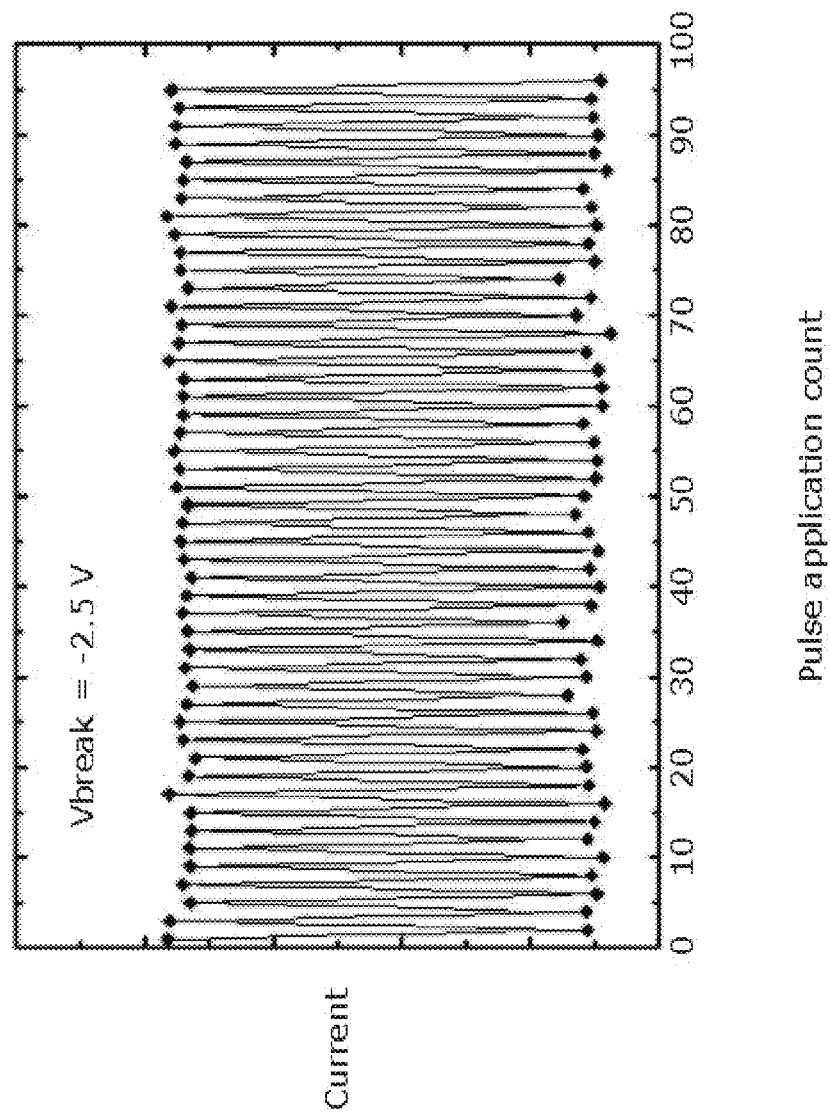
FIG. 5A shows dependency of resistance changes of a nonvolatile memory element according to Embodiment 1 of the present invention for the count of application of voltage pulses on initial breakdown voltage. The nonvolatile memory element has a variable resistance layer including an oxygen-deficient tantalum oxide and a first electrode and a second electrode both including Pt.

FIG. 5A to FIG. 5C show change of current values in three of the nonvolatile memory elements 100 on a substrate where the nonvolatile memory elements 100 are put into a low resistance state by applying initial breakdown voltage pulses Vbreak of −2.5 V, −3.5 V, and −4.0 V thereto, respectively, and then negative voltage pulses and positive voltage pulses for writing are alternately applied to the nonvolatile memory elements 100. The negative voltage pulses for writing have a voltage of −1.5 V and a pulse width of 100 ns. The positive voltage pulse for writing has a voltage of +2.0 V and a pulse width of 100 ns. The current values of the nonvolatile memory elements 100 are read by applying a read voltage of 0.4 V between the electrodes. The read voltage has an amplitude sufficiently smaller than write threshold voltage and thus does not change the resistance status of the nonvolatile memory element 100 when applied thereto. In each of the FIG. 5A to FIG. 5C, the horizontal axis represents the count of application of write voltage pulses (negative voltage pulses and positive voltage pulses alternately applied), and the vertical axis represents read current values. In each of the FIG. 5A to FIG. 5C, the count of application of write voltage pulses is 100.

Figure 5D:
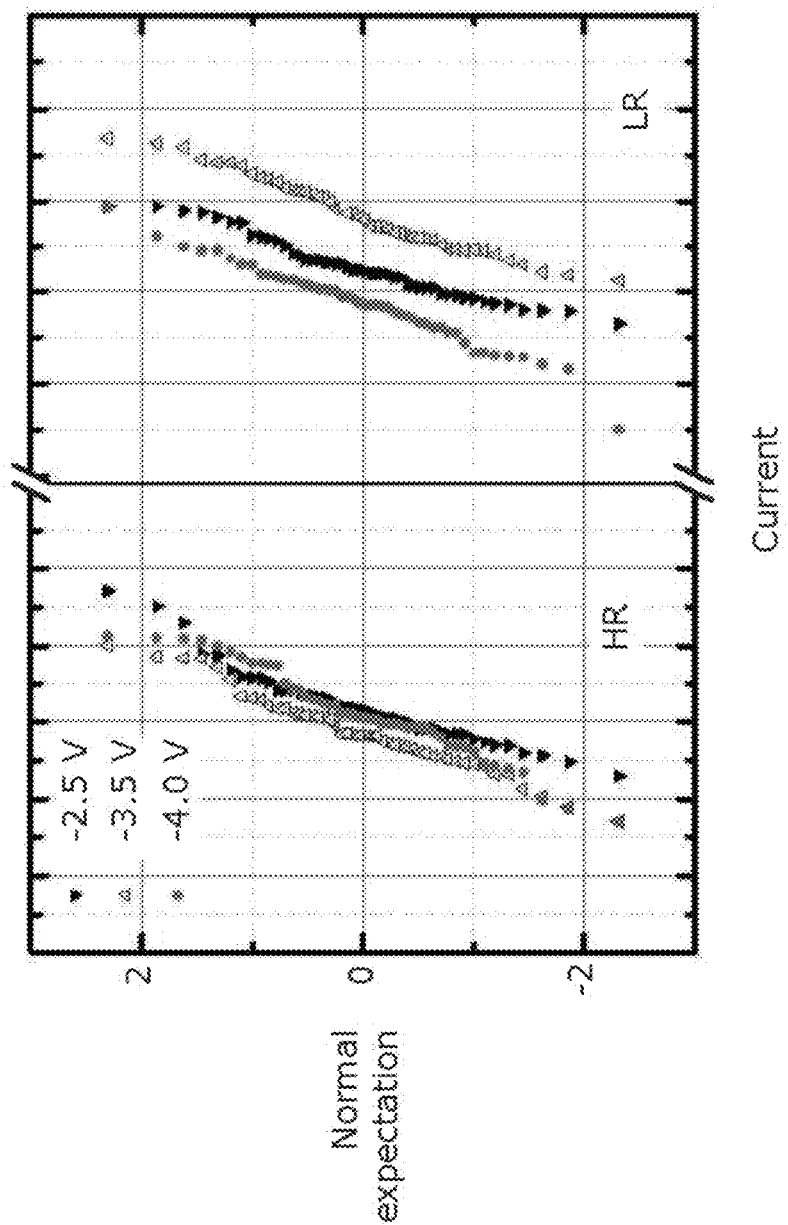
FIG. 5D shows normal distribution of current values of a nonvolatile memory element according to Embodiment 1 of the present invention in a high resistance state and normal distribution of resistance current values of the nonvolatile memory element in a low resistance state. The nonvolatile memory element has a variable resistance layer including an oxygen-deficient tantalum oxide and a first electrode and a second electrode both including Pt.

FIG. 5D shows relationships between the current values shown in FIG. 5A to FIG. 5C and normal distribution of the current values. Normal distribution of current values in the high resistance state is shown in the left-hand area of FIG. 5D, and normal distribution of current values in the low resistance state is shown in the right-hand area of FIG. 5D. The slope of the normal distribution line in FIG. 5D corresponds to distribution of the resistance values.

Figure 5E:
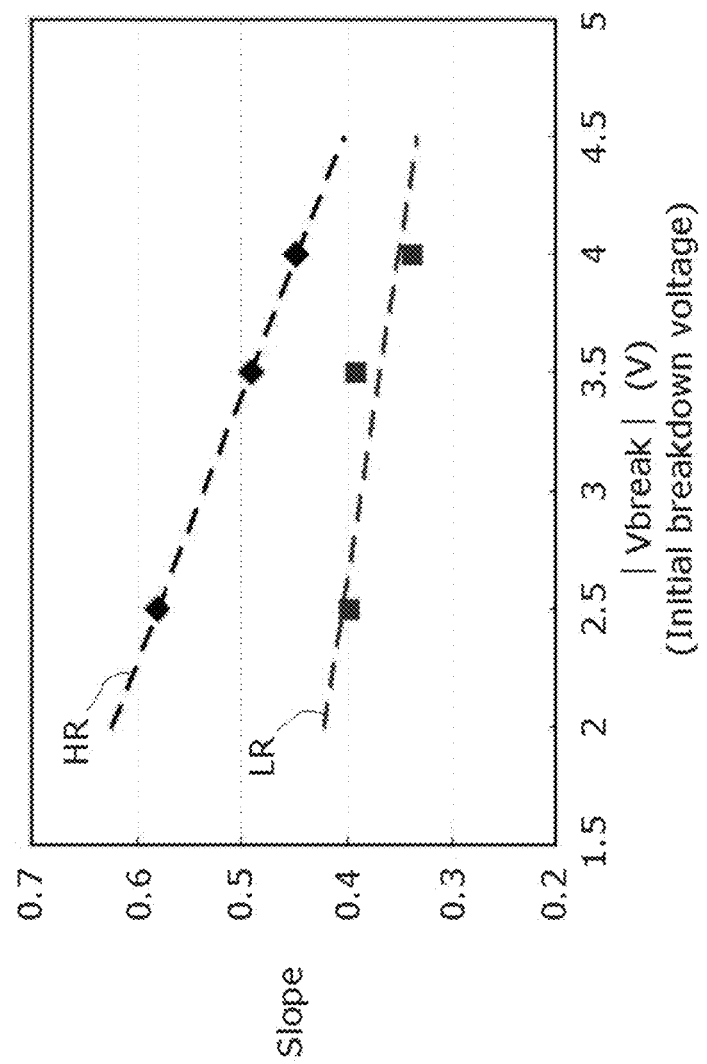
FIG. 5E shows dependency of the slopes of the normal distribution lines for the current values in the high resistance state and the low resistance state shown in FIG. 5D on initial breakdown voltage.

FIG. 5E shows relationships between the slopes of the normal distribution lines shown in the FIG. 5D and absolute values of the initial breakdown voltages. The vertical axis in FIG. 5E represents the slopes of the normal distribution lines for the current values in the high resistance state and the low resistance state, and the horizontal axis in FIG. 5E represents absolute values of the initial breakdown voltages Vbreak.

FIG. 5E shows that the larger the absolute value of the initial breakdown voltage is, the less steep the normal distribution lines for the current values both in the high resistance state and the low resistance. This means that the higher the initial breakdown voltage is, the wider the variation in the high resistance HR and in the low resistance LR is. A possible reason for this is that application of a higher initial breakdown voltage makes a larger local region 105 having defects at such a higher density that resistance is more likely to vary. Application of further increased initial breakdown voltage makes the resistance change characteristics of the nonvolatile memory elements more unstable.

Figure 6A:
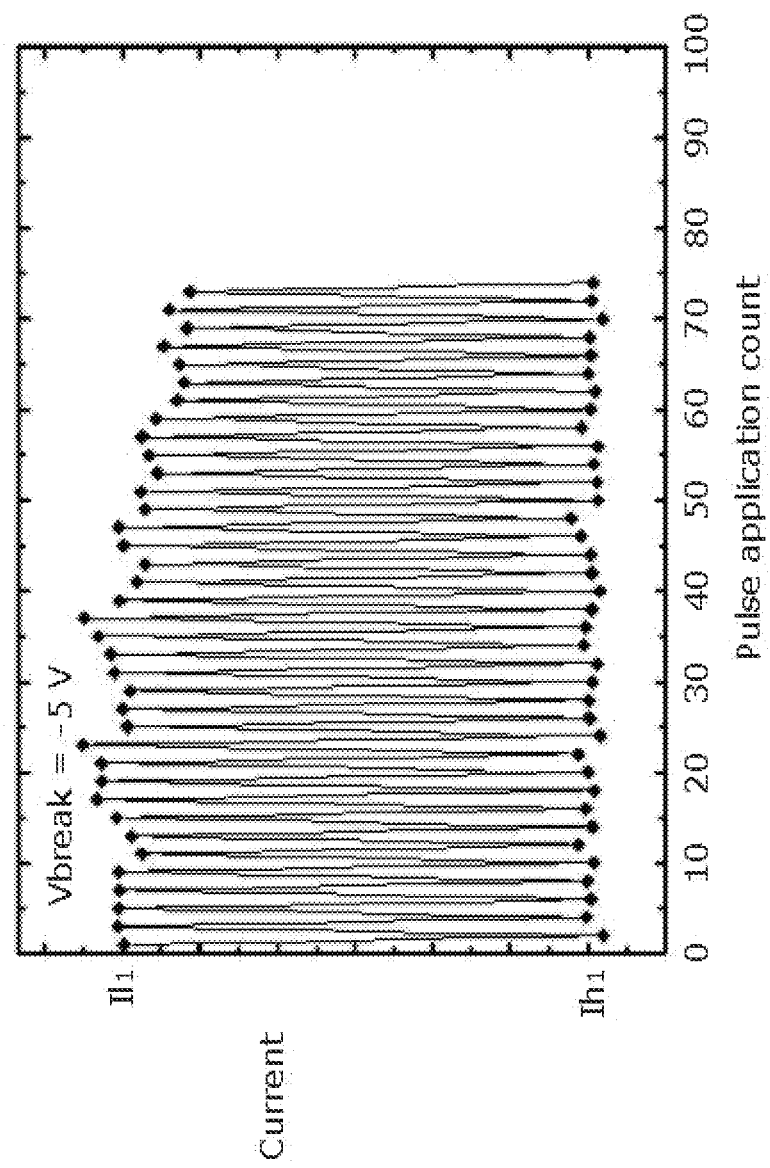
FIG. 6A shows dependency of resistance changes of a nonvolatile memory element according to Embodiment 1 of the present invention for the count of application of voltage pulses on initial breakdown voltage. The nonvolatile memory element has a variable resistance layer including an oxygen-deficient tantalum oxide and a first electrode and a second electrode both including Pt.
Figure 6B:
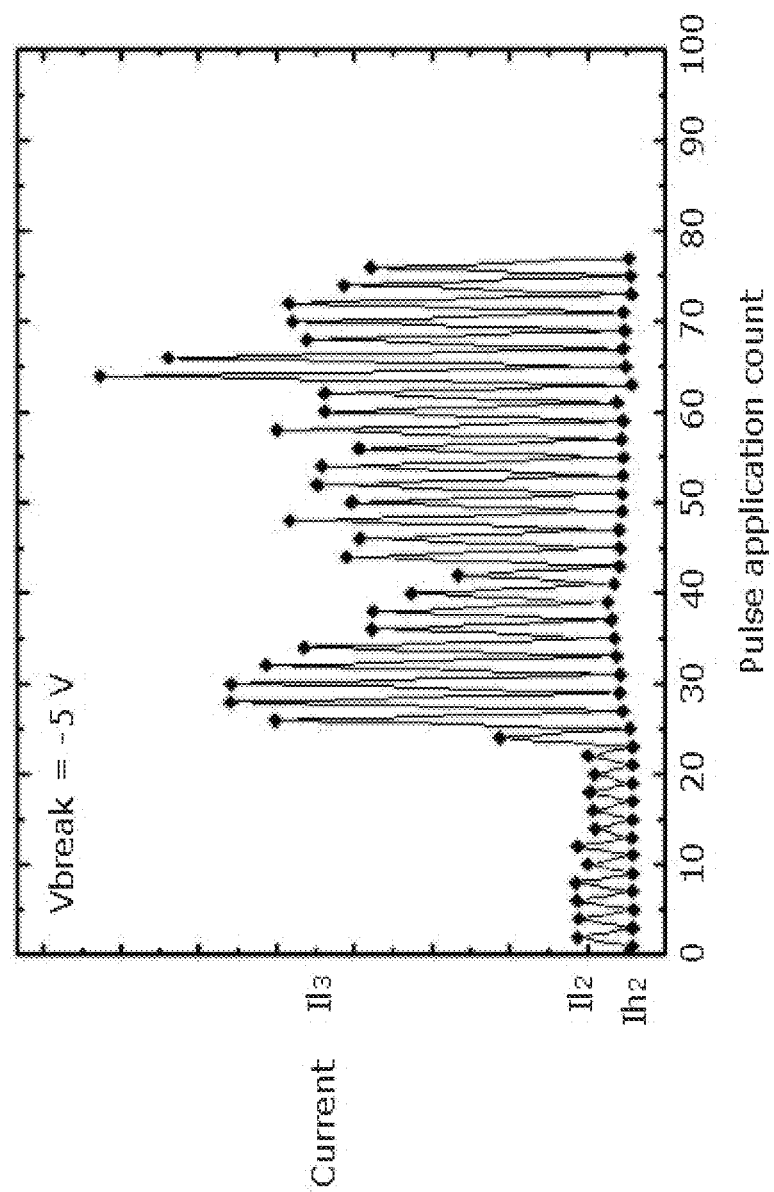
FIG. 6B shows dependency of resistance changes of a nonvolatile memory element according to Embodiment 1 of the present invention for the count of application of voltage pulses on initial breakdown voltage. The nonvolatile memory element has a variable resistance layer including an oxygen-deficient tantalum oxide and a first electrode and a second electrode both including Pt.
Figure 6C:
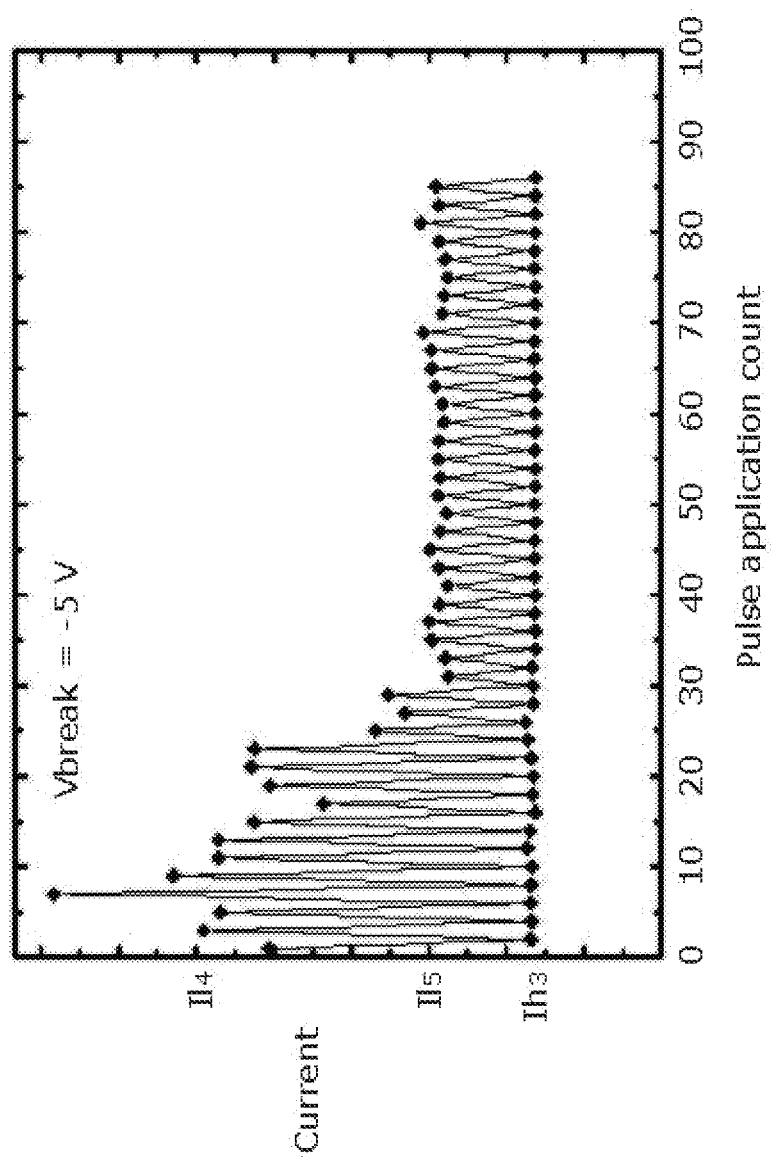
FIG. 6C shows dependency of resistance changes of a nonvolatile memory element according to Embodiment 1 of the present invention for the count of application of voltage pulses on initial breakdown voltage. The nonvolatile memory element has a variable resistance layer including an oxygen-deficient tantalum oxide and a first electrode and a second electrode both including Pt.

FIG. 6A to FIG. 6C show change of current values in three of the nonvolatile memory elements 100 on a substrate where the nonvolatile memory elements 100 are put into a low resistance state by applying initial breakdown voltage pulse Vbreak of −5 V thereto, and then negative voltage pulses and positive voltage pulses for writing are alternately applied to the nonvolatile memory elements 100. The negative voltage pulses for writing have a voltage of −1.5 V and a pulse width of 100 ns. The positive voltage pulse for writing has a voltage of +2.0 V and a pulse width of 100 ns. The current values of the nonvolatile memory elements 100 are read by applying a read voltage of 0.4 V between the electrodes. In each of the FIG. 6A to FIG. 6C, the horizontal axis represents the count of application of write voltage pulses, and the vertical axis represents read current values. In each of the FIG. 6A to FIG. 6C, the count of application of write voltage pulses is approximately 70.

The current of the nonvolatile memory element 100 shown in FIG. 6A repeats going up and down, changing to Ih1 when the positive voltage pulse is applied thereto and to Il1 when the negative voltage pulse is applied thereto. FIG. 6A shows that change in the resistance of the nonvolatile memory element 100 is stable up to at least approximately 70 times of application of voltage pulses.

The current of the nonvolatile memory element 100 shown in FIG. 6B repeats changing between Ih2 and Il2 up to approximately 20 times of application of voltage pulses but, after application of voltage pulses is performed over 20 times, changes more widely between Ih2 and Il3. FIG. 6B shows that change in the resistance of the nonvolatile memory element 100 is unstable.

The current of the nonvolatile memory element 100 shown in FIG. 6C changes less widely as the count of application of write voltage pulses increases. More specifically, the current changes between Ih3 and Il4 up to approximately 20 times of application of voltage pulses but, after application of voltage pulses is performed over 30 times, the change in the current narrows to the width between Ih3 and Il5.

FIG. 6A to FIG. 6C show that a high initial breakdown voltage of −5 V increases width of variation in resistance change characteristics among nonvolatile memory elements 100 regardless of application of initial breakdown voltage pulses of the same voltage and write voltage pulses of the same voltage. A possible reason for this is as follows. Firstly, when an initial breakdown voltage has a larger absolute value, the formed local region 105 is larger and therefore the local region 105 is larger in the vicinity of the second oxide layers 104b. As a result, the variable resistance layers 104 have filaments which vary more widely in number and shape as described above. Secondly, when an initial breakdown voltage has a large absolute value, the formed local region 105 is so large that the local region 105 penetrates through the variable resistance layer 104 to have contact both with the first electrode 103 and with the second electrode 106. As a result, there is a possibility that resistance may change both near the interface between the local region 105 and the first electrode 103 and near the interface between the local region 105 and the second electrode 106. This gives the nonvolatile memory element 100 a property that the resistance of the nonvolatile memory element 100 changes in two modes, and therefore the resistance of the nonvolatile memory element 100 may not change in a desired, stable manner.

These results of the experiments show that a nonvolatile memory element having stable resistance change characteristics can be obtained by applying an appropriate initial breakdown voltage to form the local region 105 having a degree of oxygen deficiency higher than the degree of oxygen deficiency of an area surrounding the local region 105 so that the local region 105 has no contact with the first electrode 103.

(Variation)

Figure 7:
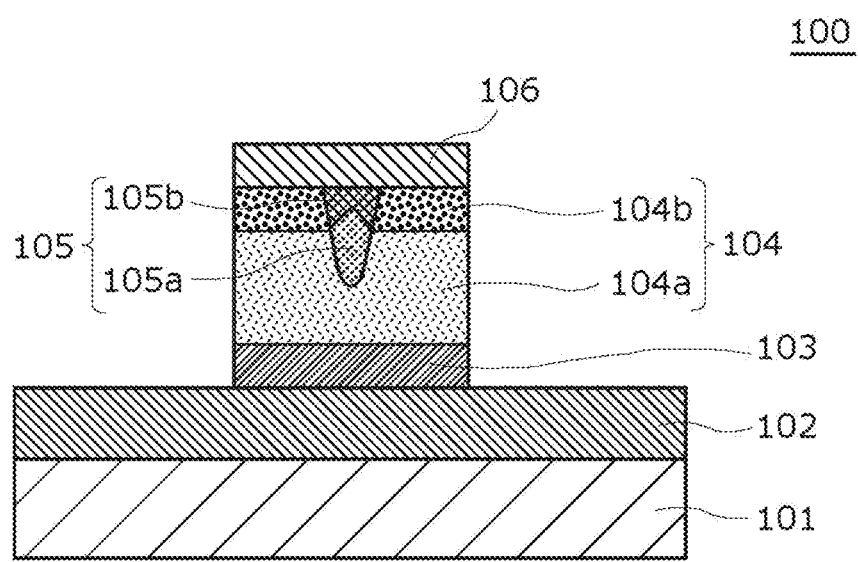
FIG. 7 is a cross-sectional view of a nonvolatile memory element according to a variation of Embodiment 1 of the present invention.

FIG. 7 is a cross-sectional view showing an exemplary configuration of a nonvolatile memory element according to a variation of Embodiment 1 of the present invention. The following describes only differences from the nonvolatile memory element 100 according to Embodiment 1.

The nonvolatile memory element 100 according to the variation of Embodiment 1 is different from the nonvolatile memory element 100 in Embodiment 1 that the local region 105 includes a first local region 105a formed in the first oxide layer 104a, a second local region 105b located between the first local region 105a and the second electrode 106 and having contact with the second electrode 106.

The first local region 105a has no contact with the first electrode 103. The first local region 105a has a degree of oxygen deficiency higher than the degree of oxygen deficiency of the first oxide layer 104a. The second local region 105b has a degree of oxygen deficiency lower than the degree of oxygen deficiency of the first local region 105a and higher than the degree of oxygen deficiency of the second oxide layer 104b.

The second local region 105b is a region where filaments are efficiently formed. The first local region 105a is a region which assists exchange of oxygen to and from the second local region 105b and thereby assists formation of filaments therein. Change in the resistance of the variable resistance layer 104 occurs in the second local region 105b. A current thus dominantly flows in the second local region 105b including filaments and the first local region 105a having a relatively low resistance when a driving voltage is applied to the variable resistance layer 104 in the low resistance state. Changing between the high resistance state and the low resistance state occurs in the second local region 105b of the variable resistance layer 104.

The first local region 105a has a size such that the lower end of the first local region 105a has no contact with the first electrode 103. The diameter of the second local region 105b varies depending on the size of the nonvolatile memory element and may be small. For example, the second local region 105b may has a diameter smaller than 40 mm (see FIG. 8B). Reduction of the local region 105, especially the second local region 105b, in size reduces variation in resistance change. However, the second local region 105b is large enough at least to securely include filaments (conduction paths) to allow a current to flow. For example, when the metal included in the second local region 105b is tantalum, the pitches between oxygen-defect sites are approximately 0.4 nm. Size of the second local region 105b may be 1 nm or longer, depending on the method of forming the local region 105. For example, the second local region 105b shown in FIG. 8A has a diameter of approximately 10 nm.

The first local region 105a is a region having a higher degree of oxygen deficiency and formed in a portion away from the second electrode 106 so as not to have contact with the first electrode 103. The second local region 105b is a region having a lower degree of oxygen deficiency and formed in a portion close to the second electrode 106 so as to penetrate the second oxide layer 104b and have contact with the second electrode 106 and the first local region 105a.

The second local region 105b may be partially less thick than the second oxide layer 104b. In other words, the second local region 105b may has a part in which the thickness of the second local region 105b measured in a direction from the first electrode 103 to the second electrode 106 is smaller than the thickness of the second oxide layer 104b. Such reduction of the second local region 105b in size optimizes the density of defect sites in the variable resistance layer 104 and thereby variation in resistance change characteristics can be effectively reduced.

Figure 8A:
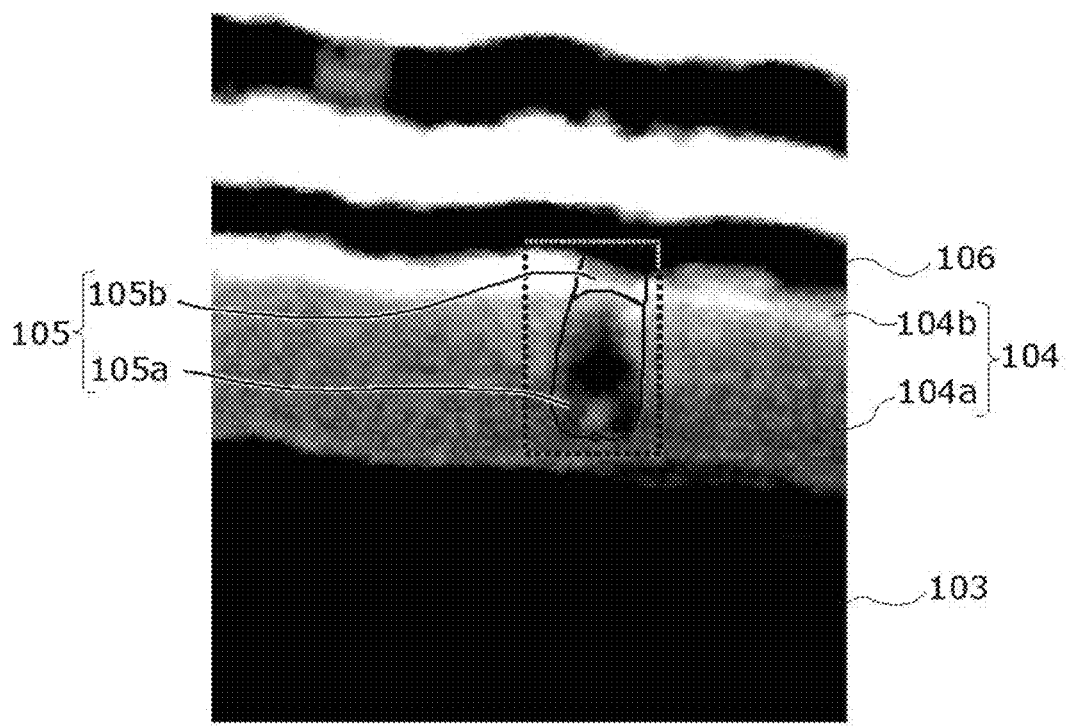
FIG. 8A is a TEM image of a local region of a nonvolatile memory element operated using an initial breakdown voltage of −2.5 V.
Figure 8B:
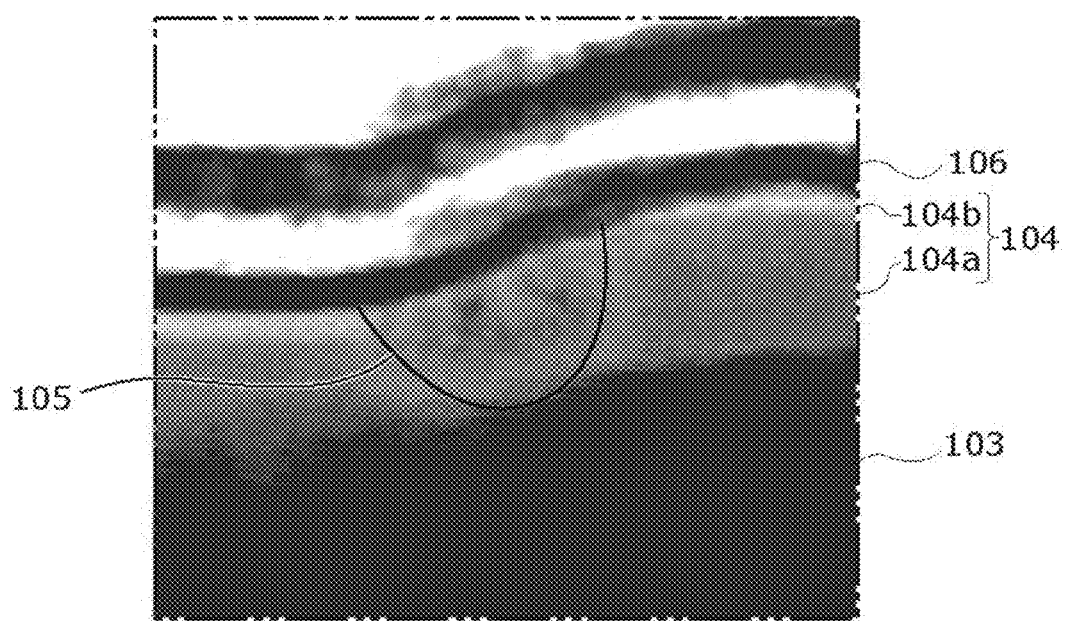
FIG. 8B is a TEM image of a local region of a nonvolatile memory element operated using an initial breakdown voltage of −5.0 V.

FIG. 8A and FIG. 8B are sectional transmission electron microscope (TEM) images of the nonvolatile memory elements 100 after resistance change. Initial breakdown voltages applied to the nonvolatile memory element 100 are different. FIG. 8A is a sectional TEM image of the nonvolatile memory element 100 after resistance change. The initial breakdown voltage applied to the nonvolatile memory element 100 is −2.5 V. FIG. 8B is a sectional TEM image of the nonvolatile memory element 100 after resistance change. The initial breakdown voltage Vbreak applied to the nonvolatile memory element 100 is −5.0 V. In the TEM images, the lighter regions indicate regions having more oxygen, and darker regions indicate regions having less oxygen. In other words, the brighter regions and the darker regions indicate regions where resistance is relatively high and regions where resistance is relatively low in the variable resistance layer 104, respectively. It should be noted the samples shown in FIG. 8A and FIG. 8B are the same ones as used for the measurements shown in FIG. 4 to FIG. 6C.

In the case shown in FIG. 8A, the second local region 105b has a diameter of approximately 10 nm, and the first local region has no contact with the first electrode 103. In FIG. 8A, the local region 105 surrounded by the first oxide layer 104a, that is, the first local region 105a is darker than the surrounding because the local region 105 (the first local region 105a) has an oxygen content atomic percentage lower than the oxygen content atomic percentage of the surrounding and thus has a lower resistance. The local region 105 penetrating through the second oxide layer 104b is darker than the second oxide layer 104b surrounding the local region 105 because the local region 105 has an oxygen content atomic percentage lower than the oxygen content atomic percentage of the second oxide layer 104b surrounding the local region 105 and thus has a lower resistance. Referring to FIG. 8B, the local region has a diameter of approximately 40 nm in the vicinity of the second oxide layer 104b and is larger than the second local region 105b shown in FIG. 8A. The first local region 105 has contact with the first electrode 103. This is the cause of the unstable operation when high initial breakdown voltage is applied.

Figure 9:
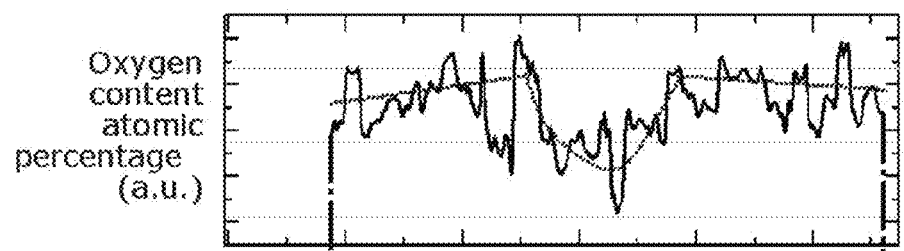
FIG. 9 illustrates a typical example of oxygen content of the variable resistance layer according to Embodiment 1 of the present invention.

FIG. 9 illustrates a typical example of oxygen content of the variable resistance layer 104 according to Embodiment 1. (b) in FIG. 9 is a diagram in which oxygen content atomic percentages in the region defined by a dotted line in FIG. 8A are mapped by electron energy-loss spectroscopy (EELS). In (b) in FIG. 9, the first oxide layer 104a, the second oxide layer 104b, the first local region 105a, and the second local region 105b are enclosed by dotted lines.

In (b) in FIG. 9, a region of higher the oxygen content atomic percentage is illustrated by a darker dot, and a region of lower oxygen content atomic percentage is illustrated by a lighter dot. In other words, the second oxide layer 104b is darker than the first oxide layer 104a because the oxygen content atomic percentage of the second oxide layer 104b is higher than the oxygen content atomic percentage of the first oxide layer 104a. Similarly, the oxygen content atomic percentage of the first oxide layer 104a is higher than the oxygen content atomic percentage of the first local region 105a. In addition, in the example shown in (b) in FIG. 9, the second local region 105b is less thick than the second oxide layer 104b.

(a) in FIG. 9 shows oxygen content atomic percentages along a line segment A-A' in (b) in FIG. 9. The horizontal axis of (a) in FIG. 9 corresponds to the horizontal axis of (b) in FIG. 9. As shown in (a) in FIG. 9, the oxygen content atomic percentages of the second local region 105b is lower than the oxygen content atomic percentages of the second oxide layer 104b (see the dotted line in (a) in FIG. 9).

Accordingly, the oxygen content atomic percentage in the variable resistance layer 104 is highest in the second oxide layer 104b, followed by the second local region 105b, the first oxide layer 104a, and the first local region 105. In other words, the degree of oxygen deficiency in the variable resistance layer 104 is lowest in the second oxide layer 104b, followed by the second local region 105b, the first oxide layer 104a, and the first local region 105.

It should be noted that the polarity of initial breakdown voltages is not limited to negative as in the above-described case and may be positive. When the polarity of an initial breakdown voltage is negative, oxygen in the vicinity of the interface between the first oxide layer 104a and the second oxide layer 104b is expelled by an electric field caused by initial breakdown, so that the first local region 105a is formed. In contrast, when the polarity of an initial breakdown voltage is positive, an electric field acts on oxygen in the first oxide layer 104a in the opposite direction, so that the first local region 105a is hardly formed as a result of initial breakdown. However, when a positive initial breakdown is followed by application of a negative voltage pulse for writing, the second local region 105b is formed in the same manner shown as in FIG. 8A.

Embodiment 2

The nonvolatile memory element according to above-described Embodiment 1 is applicable to nonvolatile memory devices in various embodiments. A nonvolatile memory device according to Embodiment 2 is a nonvolatile memory device including the nonvolatile memory element according to Embodiment 1. More specifically, the nonvolatile memory device according to Embodiment 2 is a crosspoint nonvolatile memory device having the nonvolatile memory elements according to Embodiment 1 interposed between a plurality of word lines and a plurality of bit lines at (three-dimensional) crosspoints between the plurality of word lines and the plurality of bit lines.

Configuration of Nonvolatile Memory Device

Figure 10:
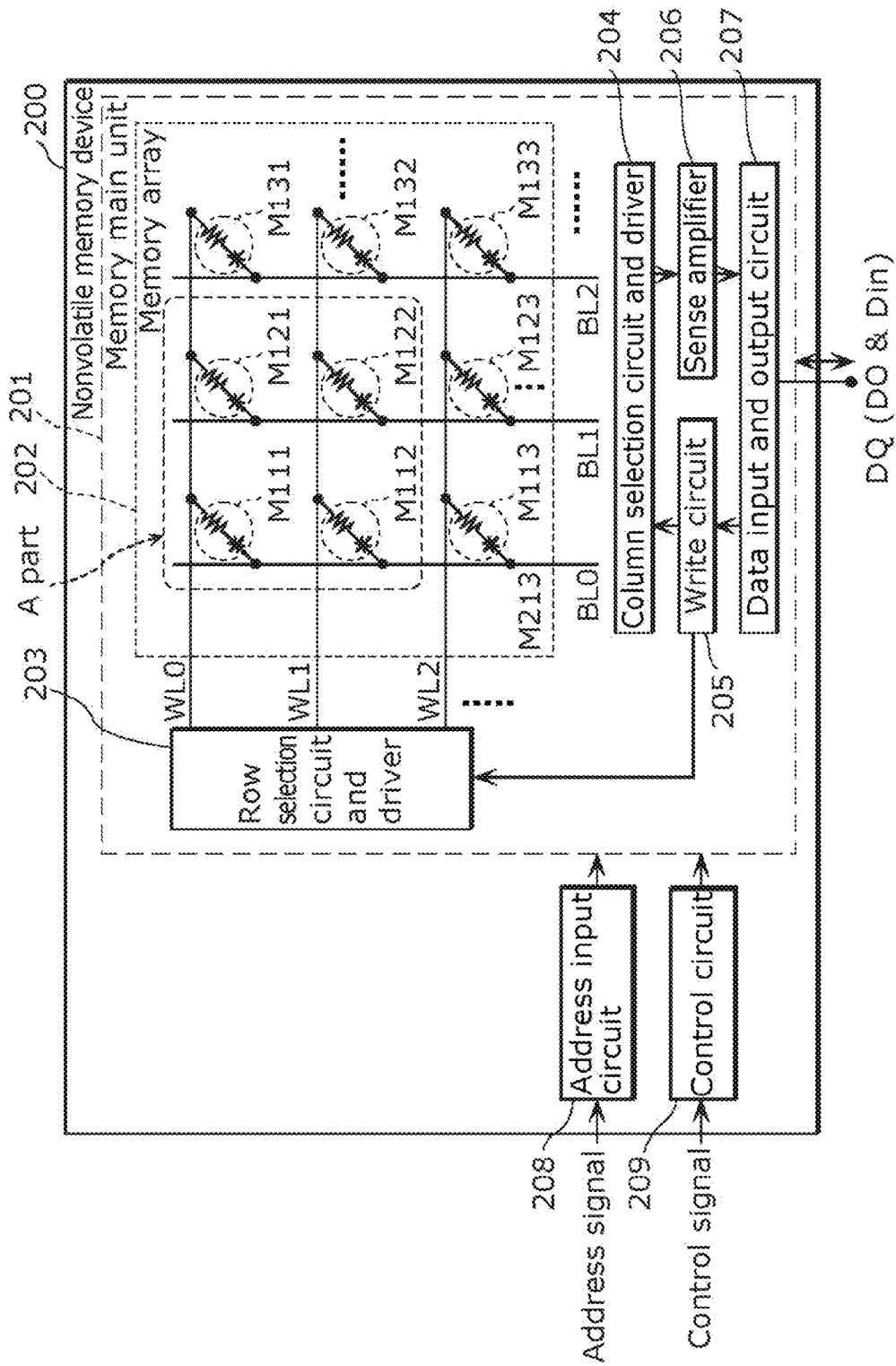
FIG. 10 is a block diagram showing a configuration of a nonvolatile memory device according to Embodiment 2 of the present invention.
Figure 11:
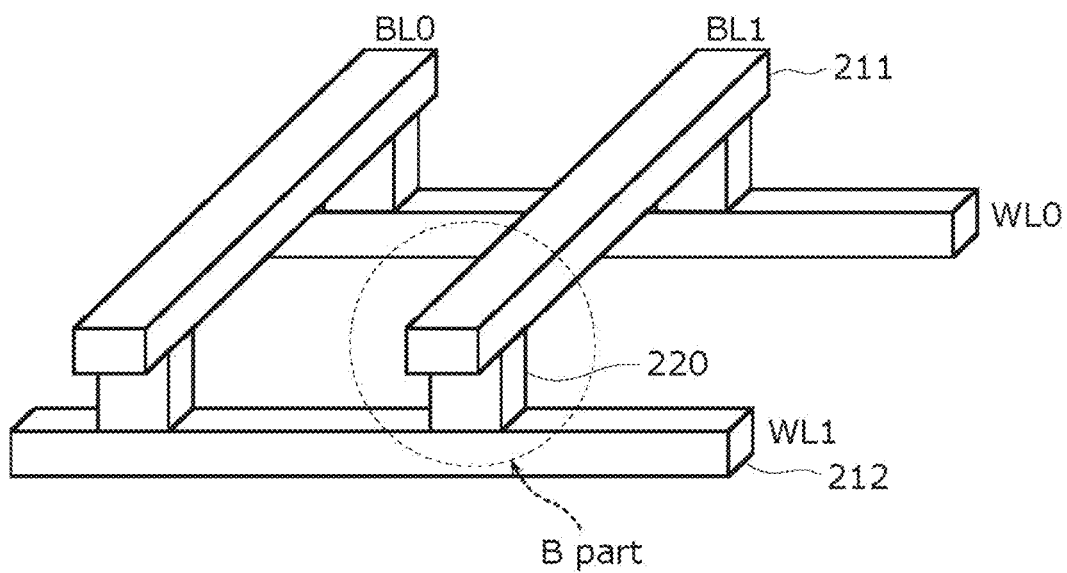
FIG. 11 is a perspective view showing a configuration of an A part (configuration for four bits) in FIG. 10.

FIG. 10 is a block diagram showing a configuration of a nonvolatile memory device 300 according to Embodiment 2 of the present invention. FIG. 11 is a perspective view showing a configuration of an A part (configuration for four bits) indicated in FIG. 10.

As shown in FIG. 10, a nonvolatile memory device 200 according to Embodiment 2 includes a semiconductor substrate and a memory main unit 201 on the semiconductor substrate. The memory main unit 201 includes a memory array 202, a row selection circuit and driver 203, a column selection circuit and driver 204, a write circuit 205 for data writing, a sense amplifier 206 which detects the amount of current flowing in a selected bit line to determine whether a data value is "1" or "0", and a data input and output circuit 207 which inputs and outputs data through a terminal DQ.

The nonvolatile memory device 200 further includes an address input circuit 208 for receiving an externally input address signal and a control circuit 209 which controls operation of the memory main unit 201 based on an externally input control signal.

As shown in FIG. 10 and FIG. 11, the memory array 202 includes a plurality of word lines WL0, WL1, WL2, . . . and a plurality of bit lines BL0, BL1, BL2, . . . . The word lines WL0, WL1, WL2, . . . are formed in parallel with each other on the semiconductor substrate. The bit lines BL0, BL1, BL2, . . . are formed in parallel with each other, lying in a plane parallel with the main surface of the semiconductor substrate above the word lines WL0, WL1, WL2, . . . . Here, the bit lines BL0, BL1, BL2, . . . three-dimensionally cross the word lines WL0, WL1, WL2, . . . .

At the three-dimensional crosspoints between the word lines WL0, WL1, WL2, . . . and the bit lines BL0, BL1, BL2, . . . provided are memory cells M111, M112, M113, M121, M122, M123, M131, M132, M133, . . . (hereinafter, referred to as "memory cells M111, M112, . . . ") in a matrix on a one-to-one basis.

Each of the memory cells M111, M112, . . . corresponds to the nonvolatile memory element according to Embodiment 1. It should be noted that each of the memory cells M111, M112, . . . in Embodiment 2 includes a current steering element as described later.

In FIG. 11, each of the memory cells M111, M112, . . . in FIG. 10 is indicated by a reference sign 220.

The address input circuit 208 receives an address signal from an external circuit (not shown) and provides a row address signal to the row selection circuit and driver 203 and a column address signal to the column selection circuit and driver 204 based on the address signal. The address signal indicates an address of a specific memory cell selected from among the memory cells M111, M112, . . . . The row address signal indicates a row address among addresses indicated in the address signal, and the column address signal indicates a column address among addresses indicated in the address signal.

In each data write cycle, the control circuit 209 provides the write circuit 205 with a write signal to instruct the write circuit 205 to apply a write voltage according to input data Din input into the data input and output circuit 207. In each data read cycle, the control circuit 209 provides the column selection circuit and driver 204 with a read signal to instruct the column selection circuit and driver 204 to perform a reading operation.

The row selection circuit and driver 203 receives the row address signal from the address input circuit 208, selects one of the word lines WL0, WL1, WL2, . . . according to the row address signal, and applies a predetermined voltage to the selected word line. The row selection circuit and driver 203 selects one or more memory cells from among the memory cells M111, M112, . . . included in the memory array 202.

The column selection circuit and driver 204 receives the column address signal from the address input circuit 208, selects one of the bit lines BL0, BL1, BL2, . . . according to the column address signal, and applies a write voltage or a read voltage to the selected bit line. The column selection circuit and driver 204 performs data writing by applying a voltage to the memory cell selected by the row selection circuit and driver 203. The column selection circuit and driver 204 performs data reading by detecting a resistance of the memory cell selected by the row selection circuit and driver 203.

Upon receiving a write signal from the control circuit 209, the write circuit 205 provides the row selection circuit and driver 203 with a signal to instruct the row selection circuit and driver 203 to apply a voltage to a selected word line and provides the column selection circuit and driver 204 with a signal to instruct the column selection circuit and driver 204 to apply a write voltage to a selected bit line.

In each data read cycle, the sense amplifier 206 detects the amount of a current flowing in a bit line selected for reading and determines whether or not the value of the read data is "1" or "0". The resultant output date DO is output to an external circuit via the data input and output circuit 207.

It is also possible to provide a multi-layered nonvolatile memory device by three-dimensionally stacking memory arrays in the nonvolatile memory device according to Embodiment 2 shown in FIG. 10 and FIG. 11. The multi-layered memory array configured in this manner serves as an ultrahigh capacity nonvolatile memory.

Configuration of Nonvolatile Memory Element

Figure 12:
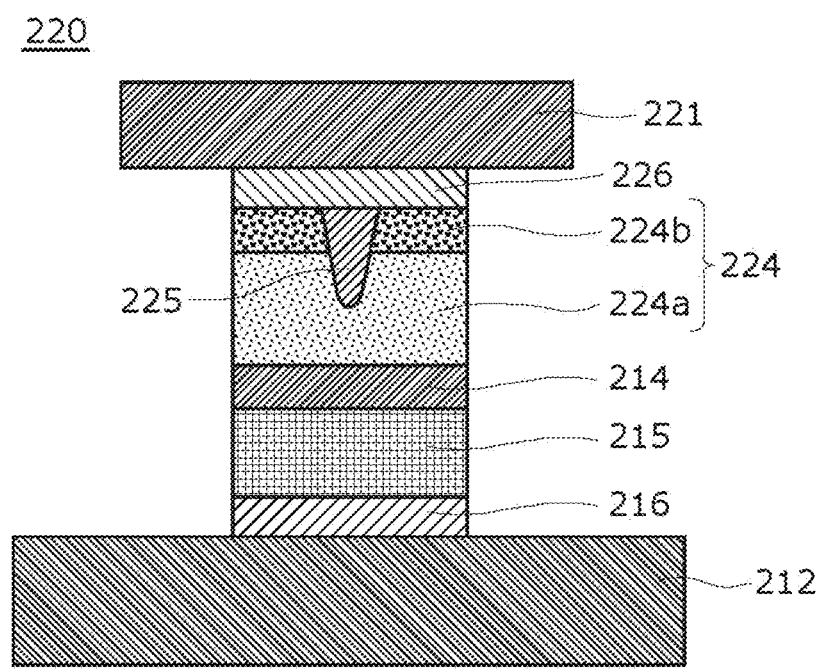
FIG. 12 is a cross-sectional view showing a configuration of a nonvolatile memory element included in the nonvolatile memory device according to Embodiment 2 of the present invention.

FIG. 12 is a cross-sectional view showing a configuration of a nonvolatile memory element 220 included in the nonvolatile memory device 200 according to Embodiment 2 of the present invention. FIG. 12 shows the configuration in a B part indicated in FIG. 11.

As shown in FIG. 12, the nonvolatile memory element 220 included in the nonvolatile memory device 200 according to Embodiment 2 connects a lower line 212 (corresponding to the word line WL1 in FIG. 11) and an upper line 211 (corresponding to the bit line BL1 in FIG. 11), and includes a lower electrode 216, a current steering element 215, an internal electrode 214, a variable resistance layer 224, and an upper electrode 226 stacked in this order. The lower line 212 and upper line 211 are copper lines.

The variable resistance layer 224 includes a first oxide layer 224a and a second oxide layer 224b formed on the first oxide layer 224a. The first oxide layer 224a has a higher degree of oxygen deficiency. The second oxide layer 224b is at a lower degree of oxygen deficiency.

The variable resistance layer 224 includes a local region 225 which is in contact with the upper electrode 226, penetrates through the second oxide layer 224b to cut partway into the first oxide layer 224a. The local region 225 thus has no contact with the internal electrode 214.

The local region 225 is provided in the first oxide layer 224a and the second oxide layer 224b to have contact with the upper electrode 226 and no contact with the internal electrode 214. The local region 225 has a degree of oxygen deficiency higher than the degree of oxygen deficiency of the second oxide layer 224b and different from the degree of oxygen deficiency of the first oxide layer 224a.

Here, the internal electrode 214, the variable resistance layer 224, the local region 225, and the upper electrode 226 respectively correspond to the first electrode 103, the variable resistance layer 104, the local region 105, and the second electrode 106 in the nonvolatile memory element 100 according to Embodiment 1 shown in FIG. 1.

The current steering element 215 is a load element serially connected to the variable resistance layer 224 via the internal electrode 214. The current steering element 215 is typically a diode, showing a non-linear current-to-voltage property. The current steering element 215 also has a bidirectional current-to-voltage property. When a voltage having an amplitude larger than or equal to the amplitude of a predetermined threshold voltage Vf (for example, +1V or higher or −1 V or lower with respect to one of the electrodes) is applied to the current steering element 215, the resistance of the current steering element 215 decreases to be conductive.

Operation of Nonvolatile Memory Device

An exemplary operation of the nonvolatile memory device according to Embodiment 2 will be described below with reference to a timing diagram shown in FIG. 13. In this operation, data is written in a write cycle and read in a read cycle.

Figure 13:
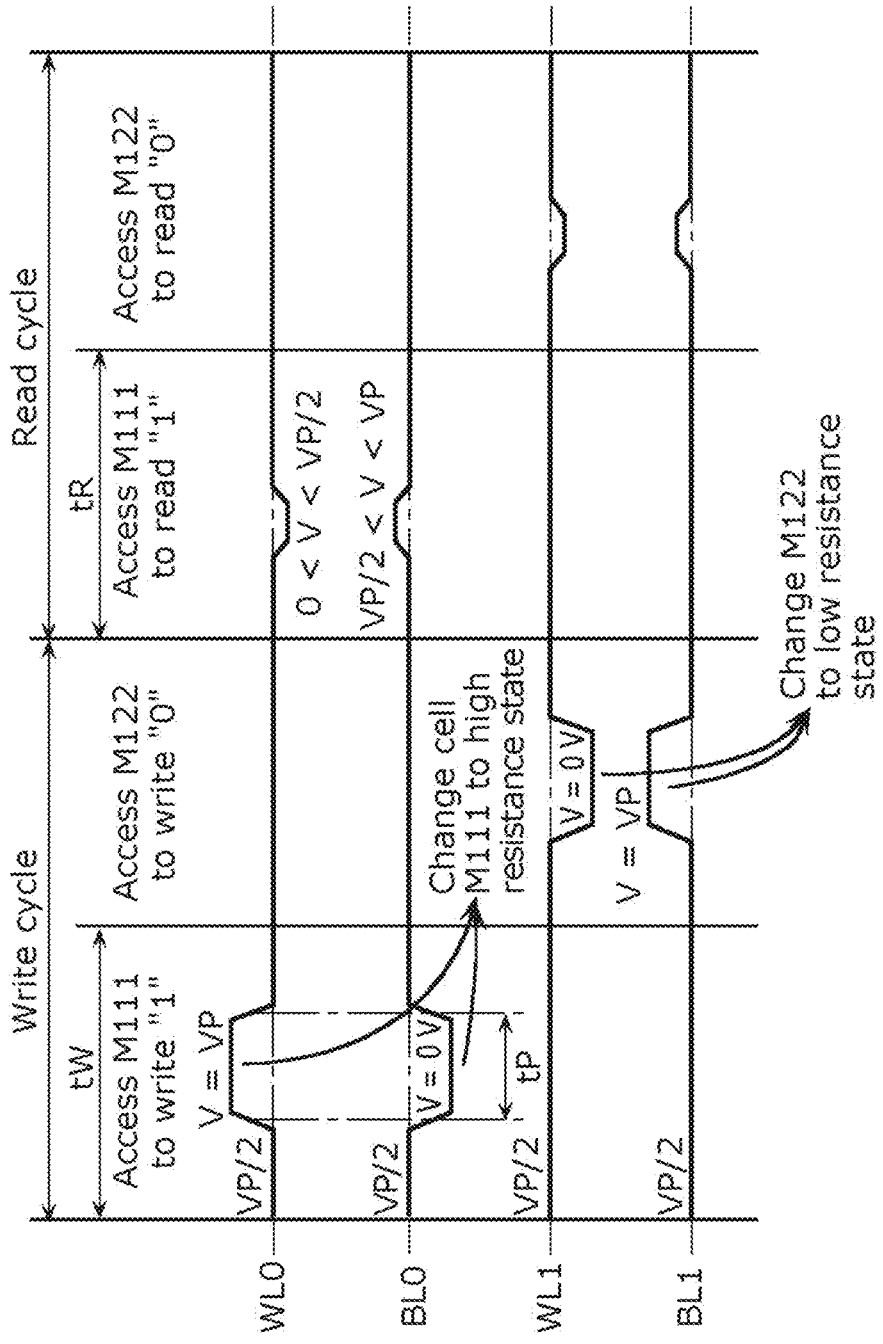
FIG. 13 is a timing diagram showing exemplary operation of the nonvolatile memory device according to Embodiment 2 of the present invention.

FIG. 13 is a timing diagram showing exemplary operation of the nonvolatile memory device 200 according to Embodiment 2 of the present invention. In this exemplary operation, a data value is "1" when the variable resistance layer 224 is in the high resistance state, and a data value is "0" when the variable resistance layer 224 is in the low resistance state. The following describes only writing and reading of data to and from the memory cells M111 and M122 for illustrative purposes.

In FIG. 13, VP denotes the amplitude of a pulse voltage necessary for changing resistance of the memory cells including a variable resistance element and a current steering element. Here, there may be a relation that VP/2<threshold voltage Vf. This is because when a voltage applied to an unselected memory cell is VP/2, the current steering element of the unselected memory cell remains non-conductive and leakage of a current into the unselected memory cell can be prevented. As a result, wasteful current flow into memory cells to which data is not to be written is prevented, and thereby consumption current can be further lowered. Moreover, this also produces an advantageous effect that unintended writing of data to unselected memory cells (generally referred to as disturbance) is prevented. A voltage of VP is applied to a selected memory cell, having a relation that threshold voltage Vf<VP.

In FIG. 13, tW denotes a write cycle period which is time taken to perform one write cycle, and tR denotes a read cycle period which is time taken to perform one read cycle.

In the write cycle of the memory cell M111, a pulse voltage VP having a pulse width of tP is applied to the word line WL0, and a voltage of 0 V is concurrently applied to the bit line BL0. Consequently, a write voltage for writing a data value of "1" to the memory cell M111 is applied to the memory cell M111, and thereby the variable resistance layer 224 of the memory cell M111 is changed to a high resistance state. In other words, the data value of "1" is thereby written to the memory cell M111.

Next, in the write cycle of the memory cell M122, a voltage of 0 V having a pulse width of tP is applied to the word line WL1, and a pulse voltage VP is concurrently applied to the bit line BL1. Consequently, a write voltage for writing a data value of "0" to the memory cell M122 is applied to the memory cell M122, and thereby the variable resistance layer 224 of the memory cell M122 is changed to a low resistance state. In other words, the data value of "0" is thereby written to the memory cell M122.

In the read cycle of the memory cell M111, a pulse voltage having an amplitude smaller than the pulse for writing and a value greater than 0 V and smaller than VP/2 is applied to the word line WL0. In addition, a pulse voltage having an amplitude smaller than the pulse in the writing and a value greater than VP/2 and smaller than VP is concurrently applied to the bit line BL0. This read voltage is denoted by Vread. A data value of "1" is read by applying, to the memory cell M111, a read voltage Vread which is higher than the threshold voltage Vf and lower than VP so that a current is output which corresponds to the resistance value of the variable resistance layer 224 of the memory cell M111 in the high resistance state and detecting the value of the output current.

Next, in the read cycle of the memory cell M122, a voltage which is the same as the voltage in the read cycle of the memory cell M111 is applied to the word line WL1 and the bit line BL1 so that a current is output which corresponds to the resistance value of the variable resistance layer 224 of the memory cell M122 in the low resistance state. Then, the data value of "0" is read by detecting the value of the output current.

The nonvolatile memory device 200 according to Embodiment 2 includes the nonvolatile memory element 220 which switches between a low resistance state and a high resistance state in such a preferable manner that the nonvolatile memory device 200 can stably operate.

Embodiment 3

A nonvolatile memory device according to Embodiment 3 is a nonvolatile memory device including the nonvolatile memory element according to Embodiment 1. More specifically, the nonvolatile memory device according to Embodiment 3 is what is called a 1T1R nonvolatile memory device, which includes one transistor per nonvolatile memory cell.

Configuration of Nonvolatile Memory Device

Figure 14:
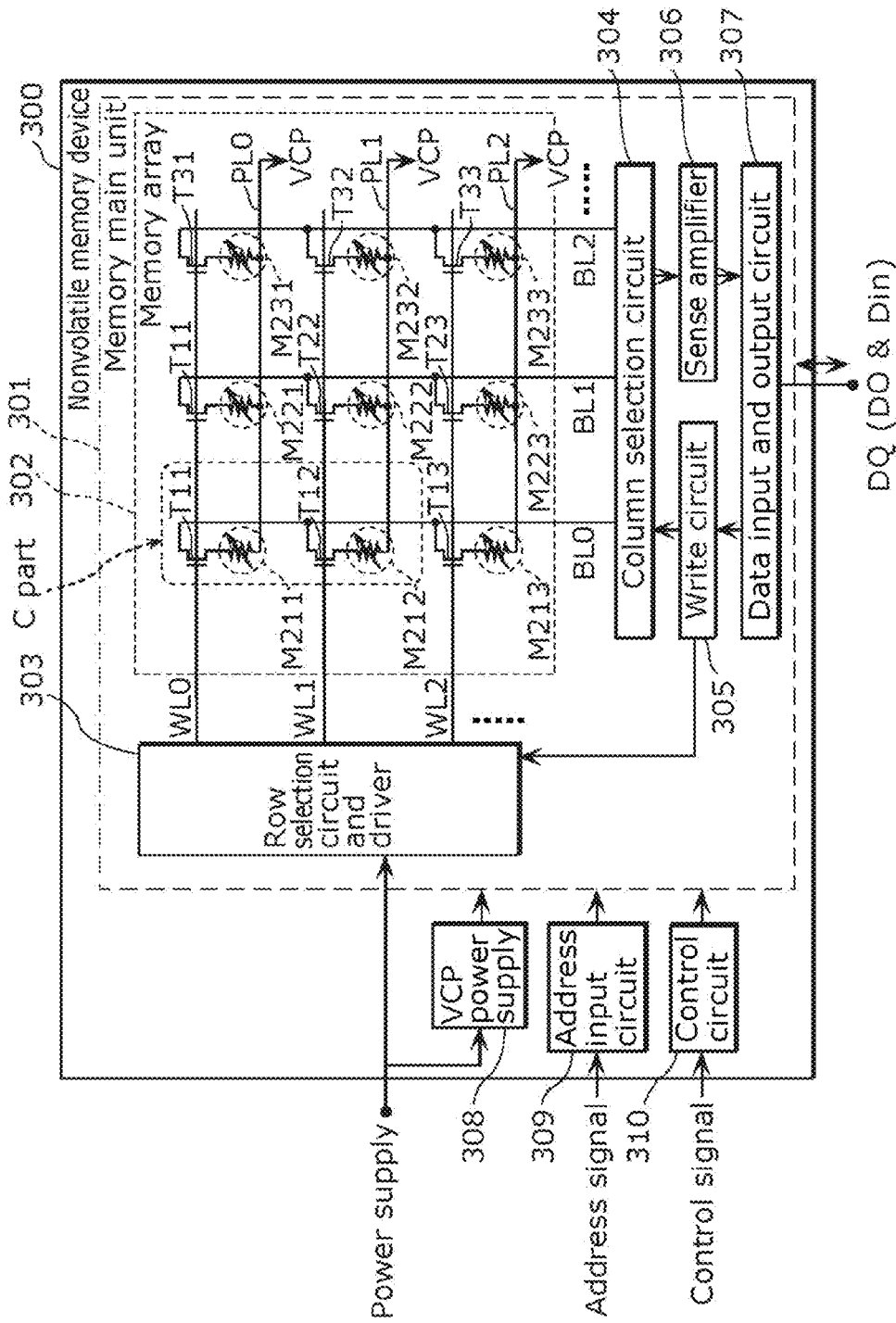
FIG. 14 is a block diagram showing a configuration of a nonvolatile memory device according to Embodiment 3 of the present invention.
Figure 15:
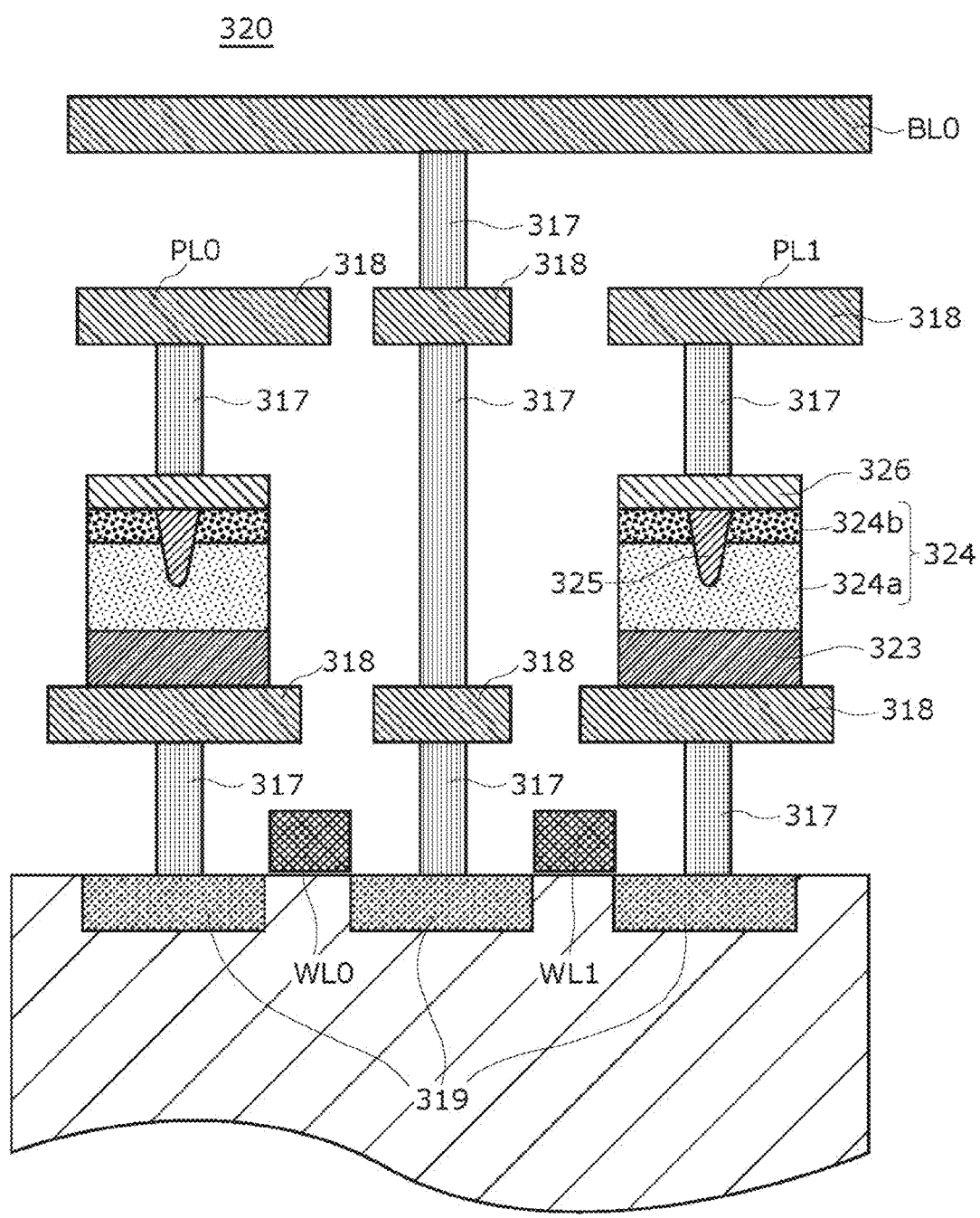
FIG. 15 is a sectional view showing a configuration of a B part (configuration for two bits) in FIG. 14.

FIG. 14 is a block diagram showing a configuration of a nonvolatile memory device 300 according to Embodiment 3 of the present invention. FIG. 15 is a sectional view showing a configuration of a part C (configuration for two bits) indicated in FIG. 14.

As shown in FIG. 14, a nonvolatile memory device 300 according to Embodiment 3 includes a semiconductor substrate and a memory main unit 301 on the semiconductor substrate. The memory main unit 301 includes a memory array 302, a row selection circuit and driver 303, a column selection circuit 304, a write circuit 305 for data writing, a sense amplifier 306 which detects the amount of current flowing in a selected bit line to determine whether a data value is "1" or "0", and data input and output circuit 307 which inputs and outputs data through a terminal DQ.

The nonvolatile memory device 300 further includes a cell plate power supply (VCP power supply) 308, an address input circuit 309 for receiving an externally input address signal and a control circuit 310 which controls operation of the memory main unit 301 based on an externally input control signal.

The memory array 302 includes: a plurality of word lines WL0, WL1, WL2, . . . and a plurality of bit lines BL0, BL1, BL2; a plurality of transistors T11, T12, T13, T21, T22, T23, T31, T32, T33 (hereinafter, referred to as "transistors T11, T12, . . . "); and a plurality of memory cells M211, M212, M213, M221, M222, M223, M231, M232, M233 (hereinafter, referred to as "memory cells M211, M212, . . . "). The plurality of word lines WL0, WL1, WL2, . . . and the plurality of bit lines BL0, BL1, BL2, . . . are formed above the semiconductor substrate so as to cross each other. The transistors T11, T12, . . . are provided to correspond to three-dimensional crosspoints between the plurality of word lines WL0, WL1, WL2, . . . and the plurality of bit lines BL0, BL1, BL2, . . . and are respectively connected to the word lines WL0, WL1, WL2, . . . and the bit lines BL0, BL1, BL2, . . . . The memory cells M211, M212, . . . are provided to correspond to the transistors T11, T12, . . . on a one-to-one basis.

Furthermore, the memory array 302 includes a plurality of plate lines PL0, PL1, PL2, . . . arranged in parallel with the word lines WL0, WL1, WL2, . . . .

As shown in FIG. 15, the bit line BL0 lies above the word lines WL0 and WL1, and the plate lines PL0 and PL1 lie between the bit line BL0 and the word lines WL0 and WL1.

Each of the memory cells M211, M212, . . . corresponds to the nonvolatile memory element according to Embodiment 1. More specifically, the nonvolatile memory element 320 in the FIG. 15 corresponds to each of the memory cells M211, M212, . . . in FIG. 14, and the nonvolatile memory element 320 includes an upper electrode 326, a variable resistance layer 324, a local region 325, and a lower electrode 323.

The variable resistance layer 324 includes a first oxide layer 324a and a second oxide layer 324b formed on the first oxide layer 324a. The first oxide layer 324a has a higher degree of oxygen deficiency. The second oxide layer 324b has a lower degree of oxygen deficiency.

The variable resistance layer 324 includes a local region 325 which is in contact with the upper electrode 326, penetrates through the second oxide layer 324b to cut partway into the first oxide layer 324a. The local region 325 thus has no contact with the lower electrode 323.

The local region 325 is provided in the first oxide layer 324a and the second oxide layer 324b to have contact with the upper electrode 326 and no contact with the lower electrode 323. The local region 325 has a degree of oxygen deficiency higher than the degree of oxygen deficiency of the second oxide layer 324b and different from the degree of oxygen deficiency of the first oxide layer 324a.

Here, the upper electrode 326, the variable resistance layer 324, the local region 325, and the lower electrode 323 respectively correspond to the first electrode 103, the variable resistance layer 104, the local region 105, and the second electrode 106 in the nonvolatile memory element 100 according to Embodiment 1 as shown in FIG. 1.

In FIG. 15, the reference sign 317 denotes a plug layer, the reference sign 318 denotes a metal wiring layer, and the reference sign 319 denotes source-drain regions.

As shown in FIG. 14, each of the transistors T11, T12, T13, . . . has a drain connected to the bit line BL0, each of the transistors T21, T22, T23, . . . has a drain connected to the bit line BL1, and each of the transistors T31, T32, T33, . . . has a drain connected to the bit line BL2.

Also as shown in FIG. 14, each of the transistors T11, T21, T31, . . . has a gate connected to the word line WL0, each of the transistors T12, T22, T32, . . . has a gate connected to the word line WL1, and each of the transistors T13, T23, T33, . . . has a gate connected to the word line WL2.

Furthermore, each of the transistors T11, T12, . . . has a source connected to the memory cells M211, M212, . . . , respectively.

Furthermore, the memory cells M211, M221, M231, . . . are connected to the plate line PL0, the memory cells M212, M222, M232, . . . are connected to the plate line PL1, and the memory cells M213, M223, M233, . . . are connected to the plate line PL2.

The address input circuit 309 receives an address signal from an external circuit (not shown) and provides a row address signal to the row selection circuit and driver 303 and a column address signal to the column selection circuit 304 based on the address signal. The address signal indicates an address of a specific memory cell selected from among the memory cells M211, M212, . . . . The row address signal indicates a row address among addresses indicated in the address signal, and the column address signal indicates a column address among addresses indicated in the address signal.

In each data write cycle, the control circuit 310 provides the write circuit 305 with a write signal to instruct the write circuit 305 to apply a write voltage according to input data Din input into the data input and output circuit 307. In each data read cycle, the control circuit 310 provides the column selection circuit 304 with a read signal to instruct the column selection circuit 304 to apply a read voltage.

The row selection circuit and driver 303 receives the row address signal from the address input circuit 309, selects one of the word lines WL0, WL1, WL2, . . . according to the row address signal, and applies a predetermined voltage to the selected word line. The row selection circuit and driver 303 selects one or more memory cells from among the memory cells M213, M223, M233, . . . included in the memory array 302.

The column selection circuit 304 receives the column address signal from the address input circuit 309, selects one of the bit lines BL0, BL1, BL2, . . . according to the column address signal, and applies a write voltage or a read voltage to the selected bit line. The column selection circuit 304 performs data writing by applying a voltage to the memory cell selected by the row selection circuit and driver 303. The column selection circuit 304 performs data reading by detecting a resistance of the memory cell selected by the row selection circuit and driver 303.

Upon receiving a write signal from the control circuit 310, the write circuit 305 provides the column selection circuit 304 with a signal to instruct the column selection circuit 304 to apply a write voltage to a selected bit line.

In each data read cycle, the sense amplifier 306 detects the amount of a current flowing in a bit line selected for reading and determines whether or not the value of the read data is "1" or "0". The resultant output date DO is output to an external circuit via the data input and output circuit 307.

The nonvolatile memory device including one transistor per nonvolatile memory cell according to Embodiment 3 has a small memory capacity compared to the crosspoint nonvolatile memory device according to Embodiment 2. However, since the nonvolatile memory device according to Embodiment 3 need not include a current steering element such as a diode, the nonvolatile memory device according to Embodiment 3 has the advantage that the CMOS process is easily applicable to the nonvolatile memory device according to Embodiment 3, and the advantage that control of operation of the nonvolatile memory device according to Embodiment 3 is easy.

Configuration of the nonvolatile memory device according to Embodiment 3 may be but not limited to the exemplary configuration shown in FIG. 14 or FIG. 15 in which the upper electrode 326 is connected to a plate line and one end of either a source or a drain of each transistor is connected to a bit line. In another configuration, a type (P-type or N-type) of transistor may be selected such that the transistor is in a source follower connection when a current is applied to a memory cell in a direction to change the memory cell into a low resistance state, and the transistor may be connected to the memory cell.

Furthermore, the configuration shown in FIG. 14 in which source lines are the plate lines for supplying a constant voltage may be change to a configuration including a driver for supplying each of the source lines with a different voltage or a different current.

Furthermore, the plate lines (source lines), which lie in parallel with the word lines as shown in FIG. 14, may be arranged parallel with the bit lines.

Exemplary Operation of Nonvolatile Memory Device

Exemplary operation of the nonvolatile memory device 300 according to Embodiment 3 will be described below with reference to a timing diagram shown in FIG. 16. In this operation, data is written in a write cycle and read in a read cycle.

Figure 16:
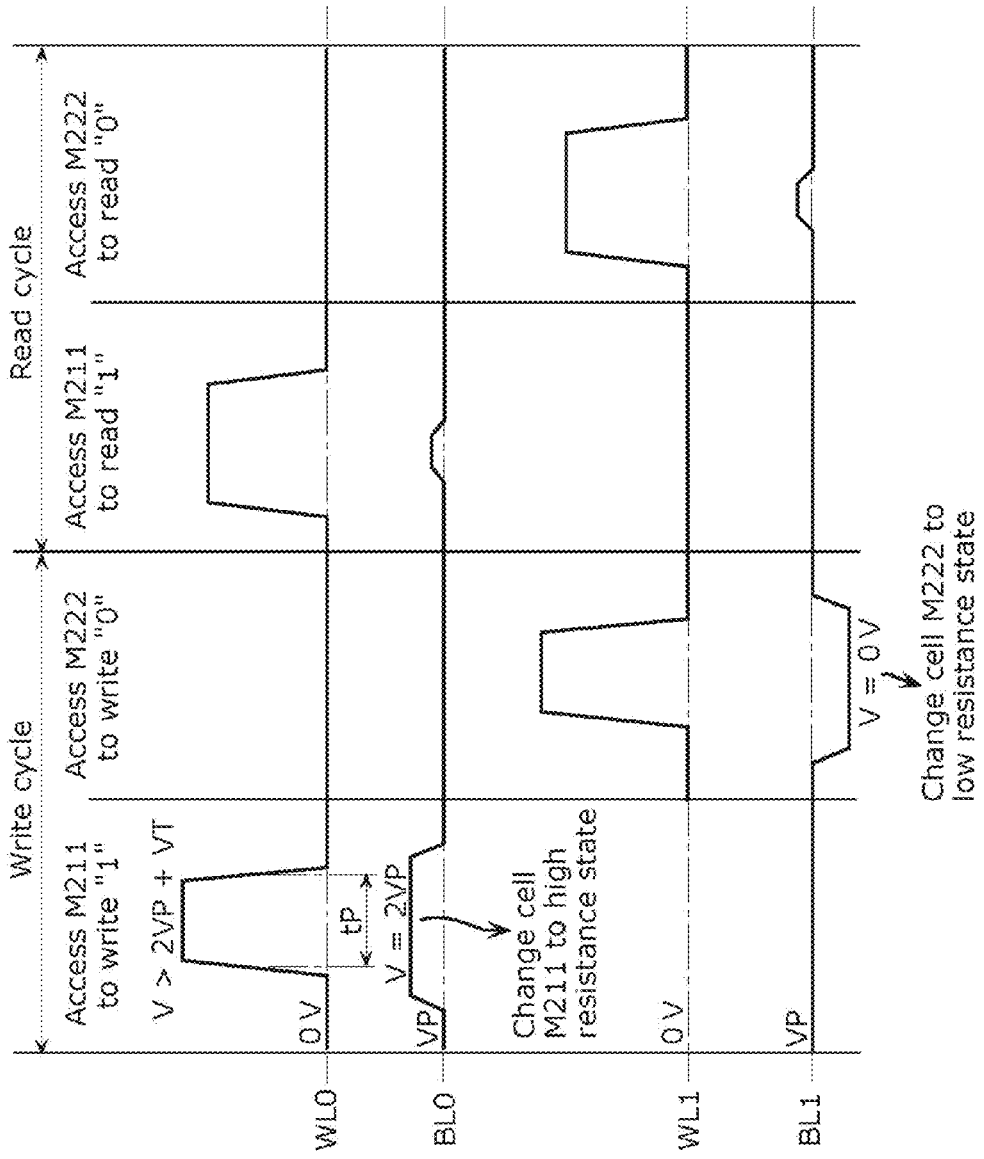
FIG. 16 is a timing diagram showing exemplary operation of the nonvolatile memory device according to Embodiment 3 of the present invention.
Figure 17:
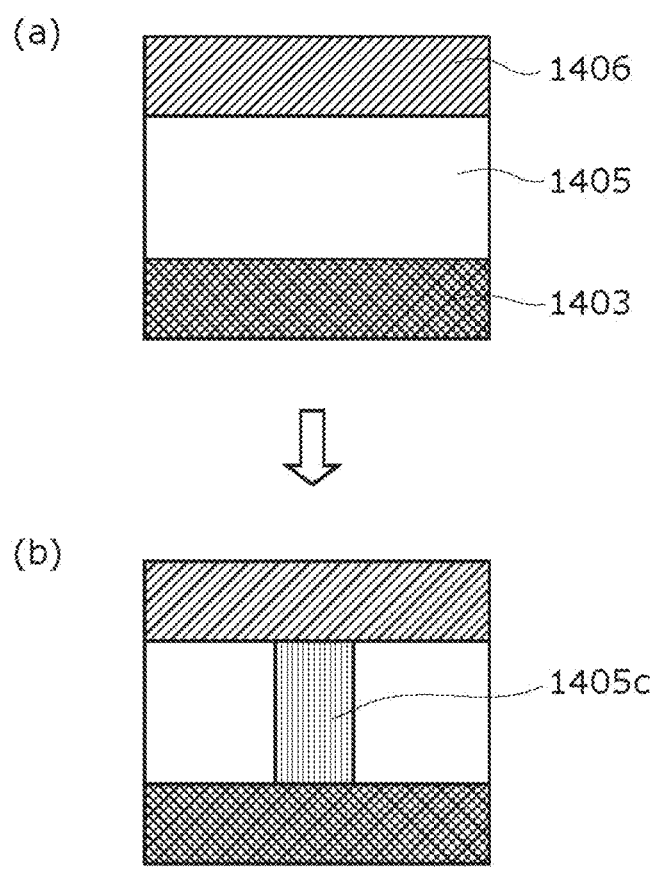
FIG. 17 is a cross-sectional view of a conventional nonvolatile memory element.

FIG. 16 is a timing diagram showing exemplary operation of the nonvolatile memory device 300 according to Embodiment 3 of the present invention. In this exemplary operation, a data value is "1" when the variable resistance layer 324 is in the high resistance state, and a data value is "0" when the variable resistance layer 324 is in the low resistance state. The following describes only writing and reading of data to and from the memory cells M211 and M222 for illustrative purposes.

In FIG. 16, VP denotes a pulse voltage necessary for changing resistance of the variable resistance elements, and VT indicates a threshold voltage of the transistors. A voltage VP is constantly applied to the plate lines. The bit lines are also precharged to the voltage VP when not selected.

In a write cycle of the memory cell M211, a voltage which has a pulse width of tP and is higher than the total of two times of the pulse voltage VP and the threshold voltage VT of the transistor is applied to the word line WL0. Consequently, the transistor T11 turns ON. Concurrently, two times of the pulse voltage VP is applied to the bit line BL0. Consequently, a write voltage for writing a data value of "1" to the memory cell M211 is applied to the memory cell M211, and thereby the variable resistance layer 324 of the memory cell M211 is changed to a high resistance state. In other words, the data value of "1" is thereby written to the memory cell M211.

Next, in a write cycle of the memory cell M222, a voltage which has a pulse width of tP and is higher than the total of two times of the pulse voltage VP and the threshold voltage VT of the transistor is applied to the word line WL1. Consequently, the transistor T22 turns ON. Concurrently, a voltage of 0 V is applied to the bit line BL1. Consequently, a write voltage for writing a data value of "0" to the memory cell M222 is applied to the memory cell M222, and thereby the variable resistance layer 324 of the memory cell M222 is changed to a low resistance state. In other words, the data value of "0" is thereby written to the memory cell M222.

In the read cycle of the memory cell M211, a predetermined voltage to turn the transistor T11 is applied to the word line WL0, and a pulse voltage having an amplitude smaller than the pulse width for the writing is concurrently applied to the bit line BL0. A current is thereby output which corresponds to the resistance value of the variable resistance layer 324 of the memory cell M211 in the high resistance state. Then, a data value of "1" is read by detecting the value of the output current.

Next, in the read cycle of the memory cell M222, a voltage which is the same as the voltage in the read cycle of the memory cell M211 is applied to the word line WL1 and the bit line BL1 so that a current is output which corresponds to the resistance value of the variable resistance layer 324 of the memory cell M222 in the low resistance state. Then, the data value of "0" is read by detecting the value of the output current.

As is the case described in Embodiment 2, the nonvolatile memory device 300 according to Embodiment 3 includes the nonvolatile memory element 320 which switches between a low resistance state and a high resistance state in such a preferable manner that the nonvolatile memory device 300 can stably operate.

The method of manufacturing the nonvolatile memory elements in the above-described embodiments is not limited to aspects of the above-described embodiments. In other words, for electronic devices having variable resistance elements, the nonvolatile memory elements in the above-described embodiments can be manufactured using either the above-described method or a method which is a combination of the above-described method and any known method.

The present invention is not limited to the above-described embodiments used as a basis of the description of the nonvolatile memory element and nonvolatile memory device according to the present invention. The present invention also includes variations of the above-described embodiments conceived by those skilled in the art unless they depart from the spirit and scope of the present invention. The present invention also includes a different embodiment where the components in the above-described embodiments are used in any combination unless they depart from the spirit and scope of the present invention.

For example, the positions of the first oxide layer 104a and the second oxide layer 104b in the layered structure of the variable resistance element in the above-described embodiments may be interchanged. Furthermore, the layers in the layered structure may be embedded in a contact hole.

Furthermore, each nonvolatile memory element 100 in the above-described embodiments may have a plurality of the local region 105.

Furthermore, the plate lines (source lines) lying in parallel with the word lines in the above-described embodiments may be arranged parallel with the bit lines. Furthermore, the plate lines which set the transistors at a common potential in the above-described embodiments may be provided with a plate line selection circuit and driver having the same configuration as the row selection circuit and driver. In this configuration, plate lines selected and plate lines not selected are driven at different voltages (different in levels and/or polarity).

INDUSTRIAL APPLICABILITY

The present invention is applicable to nonvolatile memory elements and nonvolatile memory devices, and particularly to memory elements and memory devices used in electronic devices such as electronic digital appliances, memory cards, personal computers, and mobile computers.

REFERENCE SIGNS LIST 100, 220, 320, 1400 nonvolatile memory element
101 substrate
102 interlayer insulating film
103, 1403 first electrode
104, 224, 324, 1405 variable resistance layer
104a, 224a, 324a first oxide layer
104b, 224b, 324b second oxide layer
105, 225, 325 local region
105a first local region
105b second local region
106, 1406 second electrode
107 pattern
200, 300 nonvolatile memory device
201, 301 memory main unit
202, 302 memory array
203, 303 row selection circuit and driver
204 column selection circuit and driver
205, 305 write circuit
206, 306 sense amplifier
207, 307 data input and output circuit
208 address input circuit
209, 310 control circuit
211 upper line
212 lower line
214 internal electrode
215 current steering element
216, 323 lower electrode
226, 326 upper electrode 304 column selection circuit
308 VCP power supply
309 address input circuit
317 plug layer
318 metal wiring layer
319 source-drain region
1405c filament
BL0, BL1, ... bit line
T11, T12, ... transistor
M111, M112, ... memory cell
M211, M212, ... memory cell
PL0, PL1, ... plate line
WL0, WL1, ... word line

The invention claimed is:

1. A variable resistance nonvolatile memory element comprising:
   a first electrode;
   a second electrode; and
   a variable resistance layer interposed between the first electrode and the second electrode and capable of reversibly switching between a high resistance state and a low resistance state based on a polarity of a voltage applied between the first electrode and the second electrode,
   wherein the variable resistance layer includes:
   a first oxide layer comprising a first transition metal oxide;
   a second oxide layer located between and in contact with the first oxide layer and the second electrode, comprising a second transition metal oxide, and having a degree of oxygen deficiency lower than a degree of oxygen deficiency of the first oxide layer; and
   a local region located in the first oxide layer and the second oxide layer, having contact with the second electrode and no contact with the first electrode, and having a degree of oxygen deficiency higher than a degree of oxygen deficiency of the second oxide layer and different from the degree of oxygen deficiency of the first oxide layer.

2. The variable resistance nonvolatile memory element according to claim 1,
   wherein the local region includes:
   a first local region located in the first oxide layer, having no contact with the first electrode, and having a degree of oxygen deficiency higher than the degree of oxygen deficiency of the first oxide layer; and
   a second local region located between the first local region and the second electrode, having contact with the first local region and the second electrode, and having a degree of oxygen deficiency lower than the degree of oxygen deficiency of the first local region and higher than the degree of oxygen deficiency of the second oxide layer.

3. The variable resistance nonvolatile memory element according to claim 2,
   wherein the switching of the variable resistance layer between the high resistance state and the low resistance state occurs in the second local region.

4. The variable resistance nonvolatile memory element according to claim 2,
   wherein the second local region has a portion less thick than the second oxide layer in a direction from the first electrode to the second electrode.

5. The variable resistance nonvolatile memory element according to claim 1,
   wherein the transition metal oxides included in the second oxide layer and the first oxide layer are oxides of a same metal.

6. The variable resistance nonvolatile memory element according to claim 5,
   wherein the same metal is Ta.

7. The nonvolatile memory element according to claim 1,
   wherein the first electrode and the second electrode comprise a same material.

8. The variable resistance nonvolatile memory element according to claim 1, further comprising
   a load element electrically connected to the variable resistance layer.

9. The variable resistance nonvolatile memory element according to claim 8,
   wherein the load element is one of a fixed resistor, a transistor, and a diode.

10. The variable resistance nonvolatile memory element according to claim 1,
    wherein the local region formed in the variable resistance layer is a single local region in the variable resistance layer.

11. A nonvolatile memory device comprising:
    a substrate;
    a plurality of first lines formed in parallel with each other on the substrate;
    a plurality of second lines formed in parallel with each other in a plane above the plurality of first lines and three-dimensionally crossing the plurality of first lines, the plane being parallel with a main surface of the substrate;
    a memory cell array including nonvolatile memory elements each of which is the nonvolatile memory element according to claim 1 and is provided to a corresponding one of three-dimensional crosspoints between the plurality of first lines and the plurality of second lines;
    a selection circuit which selects at least one nonvolatile memory element from among the nonvolatile memory elements included in the memory cell array;
    a write circuit which writes data to the nonvolatile memory element selected by the selection circuit, by applying a voltage to the nonvolatile memory element selected by the selection circuit; and
    a read circuit which reads data by detecting a resistance of the nonvolatile memory element selected by the selection circuit.

12. The nonvolatile memory device according to claim 11,
    wherein the nonvolatile memory element includes a current steering element electrically connected to the variable resistance layer.

13. A nonvolatile memory device comprising:
    a substrate;
    a memory cell array including:
    a plurality of word lines and a plurality of bit lines formed above the substrate;
    a plurality of transistors each connected to a corresponding one of the word lines and a corresponding one of the bit lines; and
    a plurality of nonvolatile memory elements each of which is the nonvolatile memory element according to claim 1 and is provided to a corresponding one of the transistors on a one-to-one basis;
    a selection circuit which selects at least one nonvolatile memory element from among the nonvolatile memory elements included in the memory cell array;
    a write circuit which writes data to the nonvolatile memory element selected by the selection circuit, by applying a voltage to the selected nonvolatile memory element; and a read circuit which reads data by detecting a resistance of the nonvolatile memory element selected by the selection circuit.

\* \* \* \* \*